United States Patent
Nakai et al.

(10) Patent No.: US 8,964,459 B2
(45) Date of Patent: Feb. 24, 2015

(54) MAGNETORESISTIVE ELEMENT AND WRITING METHOD OF MAGNETIC MEMORY

(71) Applicant: Kabushiki Kaisha Toshiba, Minato-ku, Tokyo (JP)

(72) Inventors: Tsukasa Nakai, Hino (JP); Takashi Izumida, Yokohama (JP); Jyunichi Ozeki, Yokosuka (JP); Masaki Kondo, Kawasaki (JP); Toshiyuki Enda, Zushi (JP); Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 13/781,739

(22) Filed: Feb. 28, 2013

(65) Prior Publication Data
US 2013/0250670 A1 Sep. 26, 2013

(30) Foreign Application Priority Data

Mar. 22, 2012 (JP) ................................ 2012-066346

(51) Int. Cl.
*G11C 19/08* (2006.01)
*G11C 11/16* (2006.01)

(52) U.S. Cl.
CPC .......... *G11C 11/161* (2013.01); *G11C 11/1675* (2013.01)
USPC ............................. 365/158; 365/171; 365/173

(58) Field of Classification Search
CPC ........... G11C 14/0081; G11C 14/0036; H01L 27/222
USPC ......................................... 365/158, 171, 173
See application file for complete search history.

(56) References Cited

U.S. PATENT DOCUMENTS

| | | | |
|---|---|---|---|
| 6,980,468 B1 * | 12/2005 | Ounadjela | 365/171 |
| 7,943,974 B2 * | 5/2011 | Ishikawa et al. | 257/289 |
| 2007/0177421 A1 * | 8/2007 | Sugiyama et al. | 365/158 |
| 2007/0228501 A1 | 10/2007 | Nakamura et al. | |
| 2008/0186759 A1 | 8/2008 | Shimizu et al. | |

(Continued)

FOREIGN PATENT DOCUMENTS

| | | |
|---|---|---|
| JP | 2003-298025 A | 10/2003 |
| JP | 2010081172 A | 4/2010 |

(Continued)

OTHER PUBLICATIONS

Japanese Office Action dated Jun. 24, 2014 in counterpart Japanese Application No. 2012-066346.
R. Scheuerlein et al, "A 10ns Read and Write Non-Volatile Memory Array Using a Magnetic Tunnel Junction and FET Switch in each Cell," ISSCC2000 Technical Digest p. 128, IEEE 2000.
M. Durlam et al, "A 0.18 μm 4Mb Toggling MRAM," IEDM 2003 Proceedings, 34.6, Dec. 2003.

(Continued)

*Primary Examiner* — Alexander Sofocleous
*Assistant Examiner* — Muhammad Islam
(74) *Attorney, Agent, or Firm* — Holtz, Holtz, Goodman & Chick PC

(57) ABSTRACT

According to one embodiment, a magnetoresistive element includes a first magnetic layer, a second magnetic layer, a non-magnetic layer formed between the first magnetic layer and the second magnetic layer, a charge storage layer having a first surface and a second surface different from the first surface, the first surface facing the second magnetic layer, a first insulating layer formed between the second magnetic layer and the first surface of the charge storage layer, and a second insulating layer formed on the second surface of the charge storage layer.

17 Claims, 33 Drawing Sheets

(56) References Cited

U.S. PATENT DOCUMENTS

| | | |
|---|---|---|
| 2010/0073025 A1 | 3/2010 | Tanamoto et al. |
| 2010/0246252 A1 | 9/2010 | Ohno et al. |

FOREIGN PATENT DOCUMENTS

| | | |
|---|---|---|
| JP | 2011-138924 A | 7/2011 |
| JP | 2011-241137 A | 12/2011 |

OTHER PUBLICATIONS

D. Chiba et al, "Electrical control of the ferromagnetic phase transition in cobalt at room temperature," Nature Materials, DOI: 10.1038/NMAT3130, 2001.

Y. Yamada et al, "Electrically Induced Ferromagnetism at Room Temperature in Cobalt-Doped Titanium Dioxide," Science, vol. 332, No. 6033, pp. 1065-1067, DII: 10.1126, May 27, 2011.

H. Ohno et al., "Semiconductor spin-electronics", Applied Physics, vol. 70, pp. 265-274 (2001).

* cited by examiner

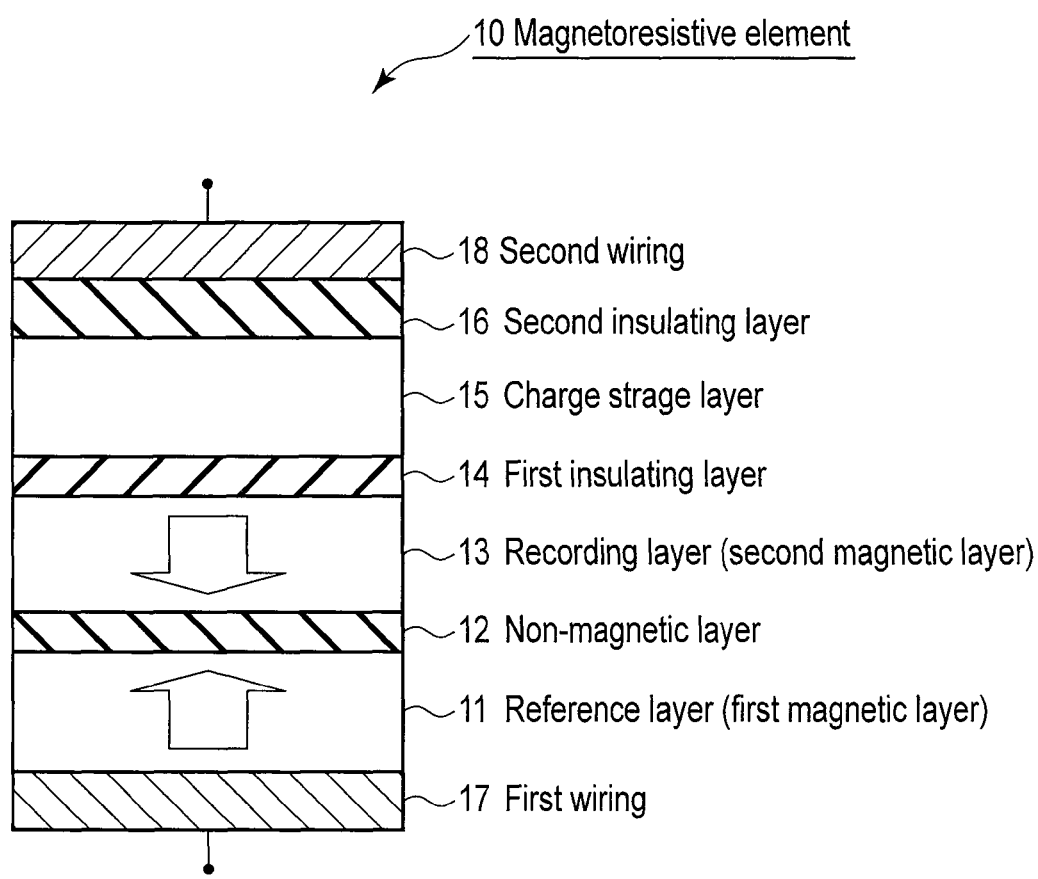
F I G. 1

B type (initial state = parallel)

| | Initial state | Write | Erase |
|---|---|---|---|
| Electron current direction | — | B→A | A→B |
| Charge storage layer | — | Charge accumulation | Charge discharge |
| Recording layer | — | Ferromagnetic state → paramagnetic state | Paramagnetic state → ferromagnetic state |

FIG. 4

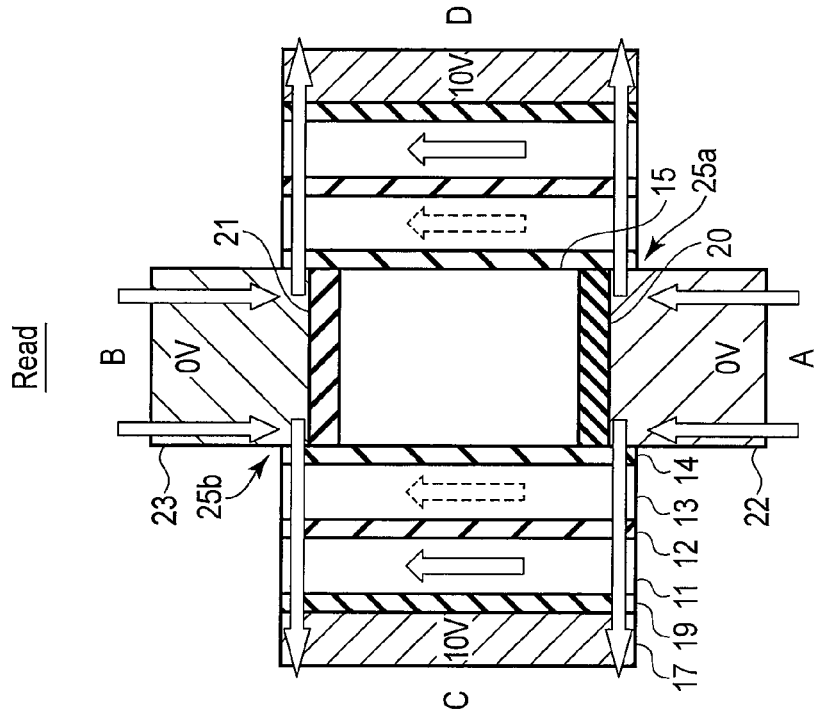
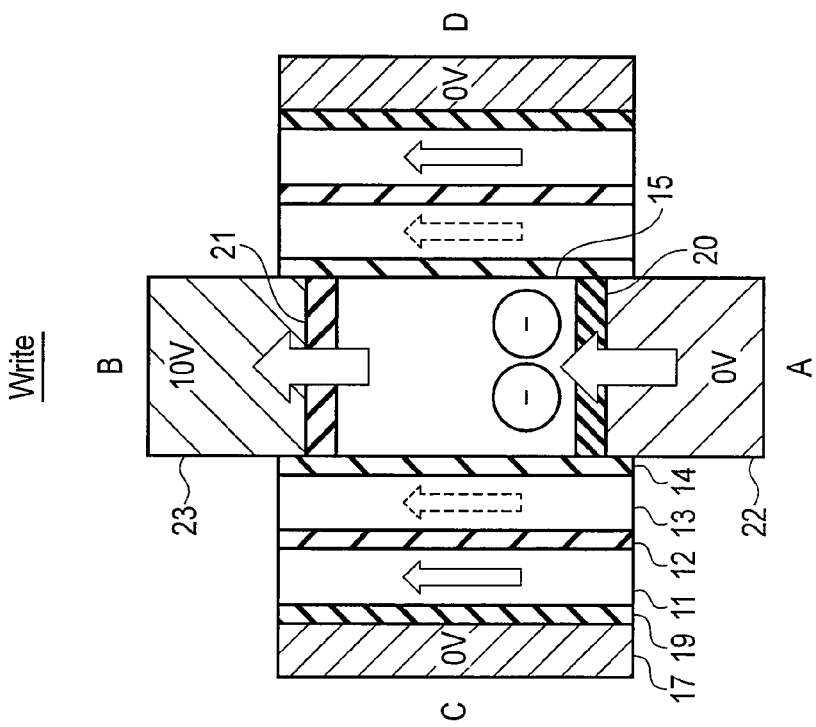
FIG. 12B
FIG. 12A

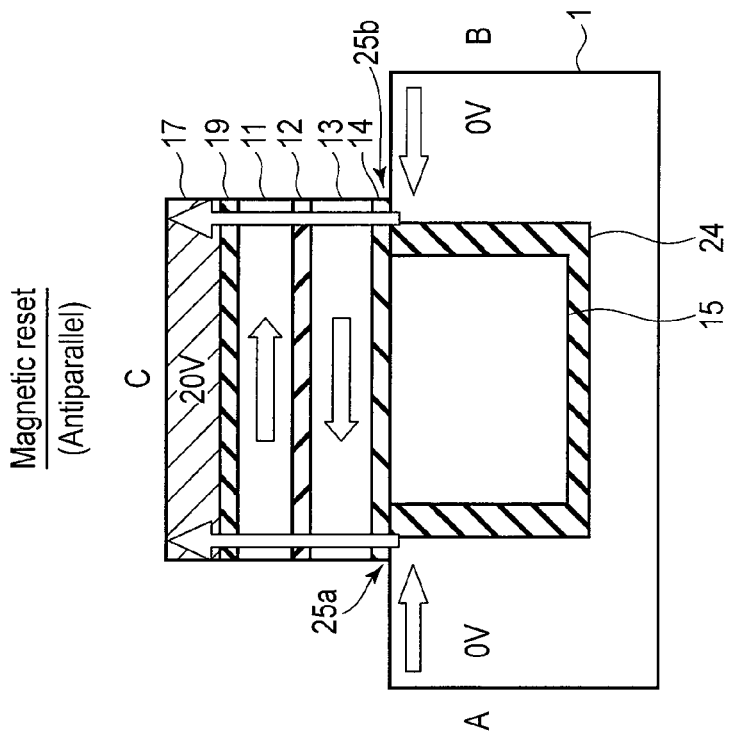
F I G. 19B
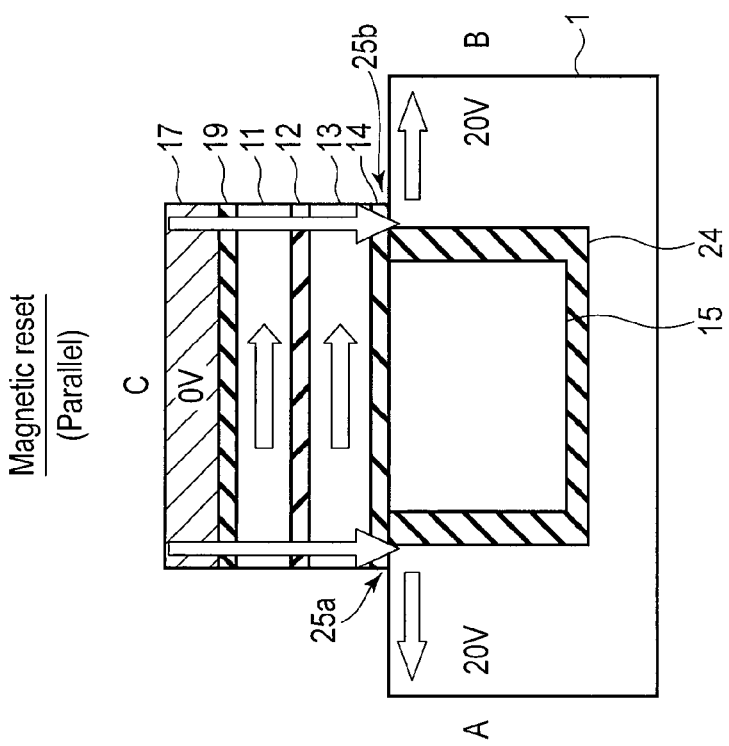
F I G. 19A

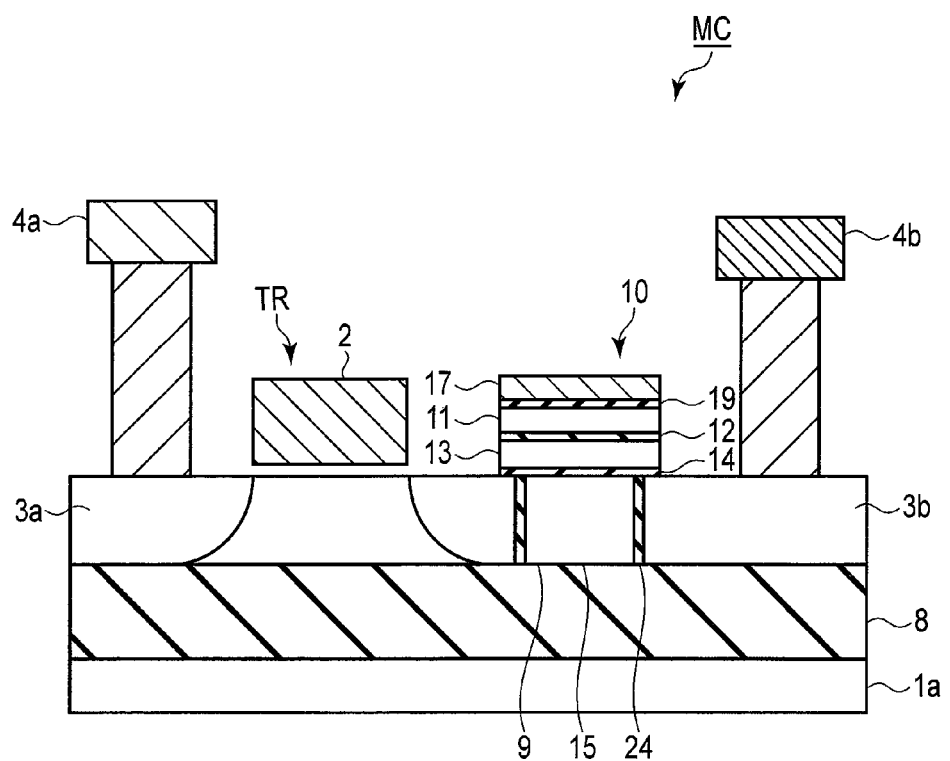
F I G. 2 5

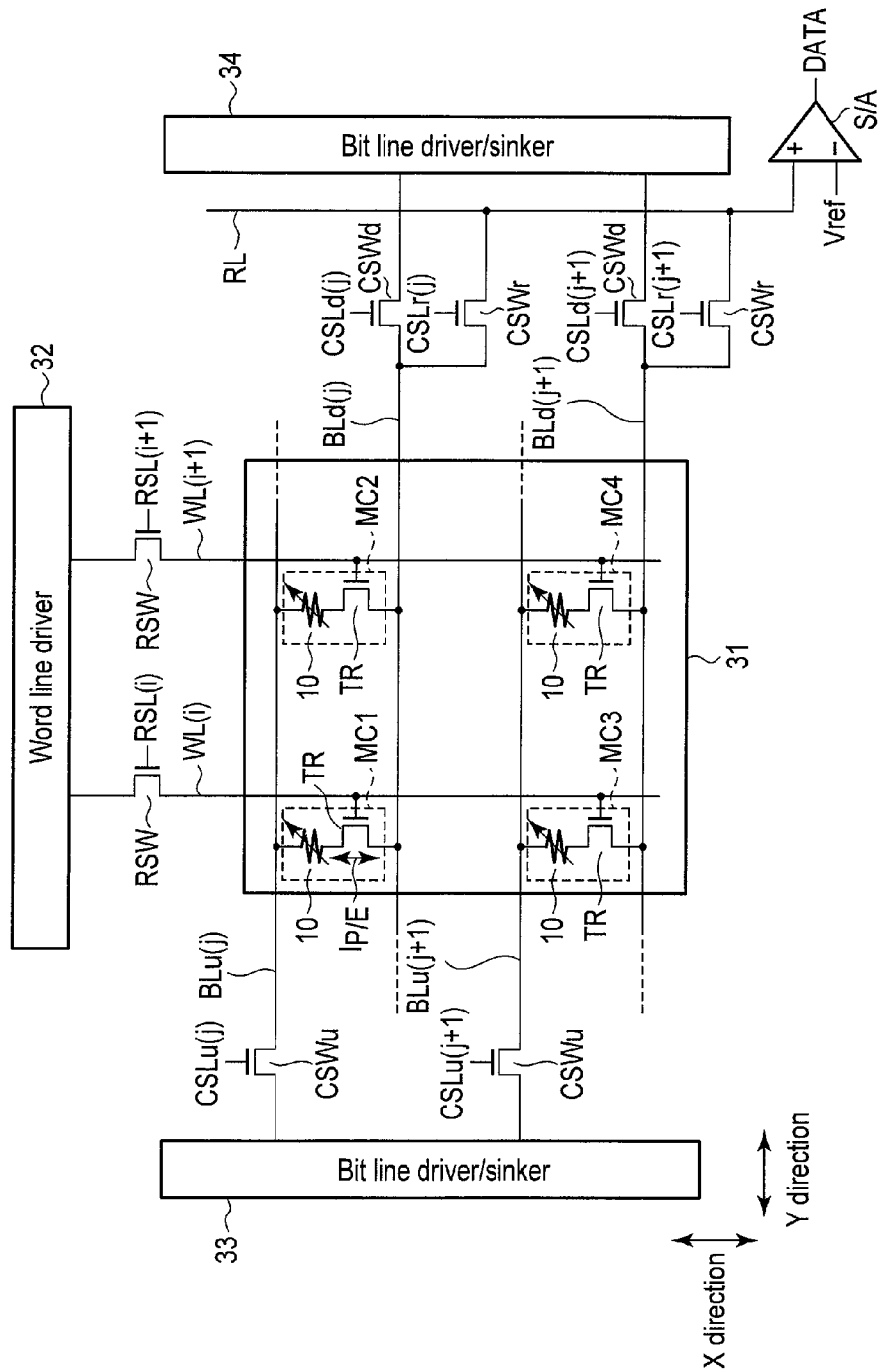
F I G. 27

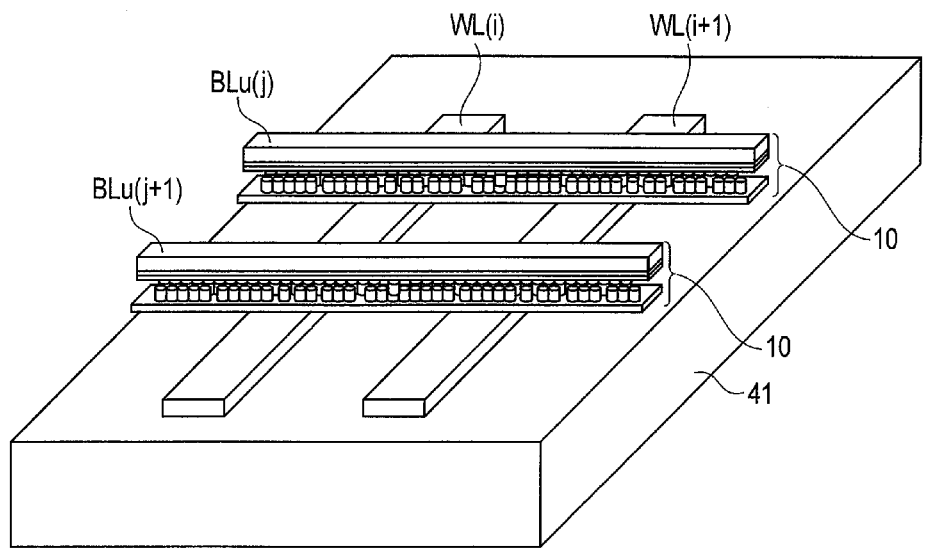
F I G. 34
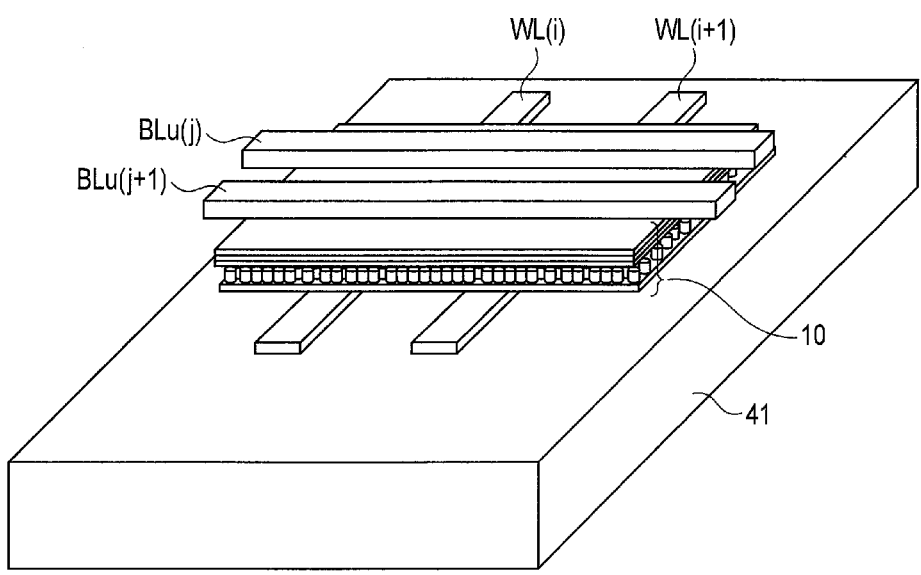
F I G. 35

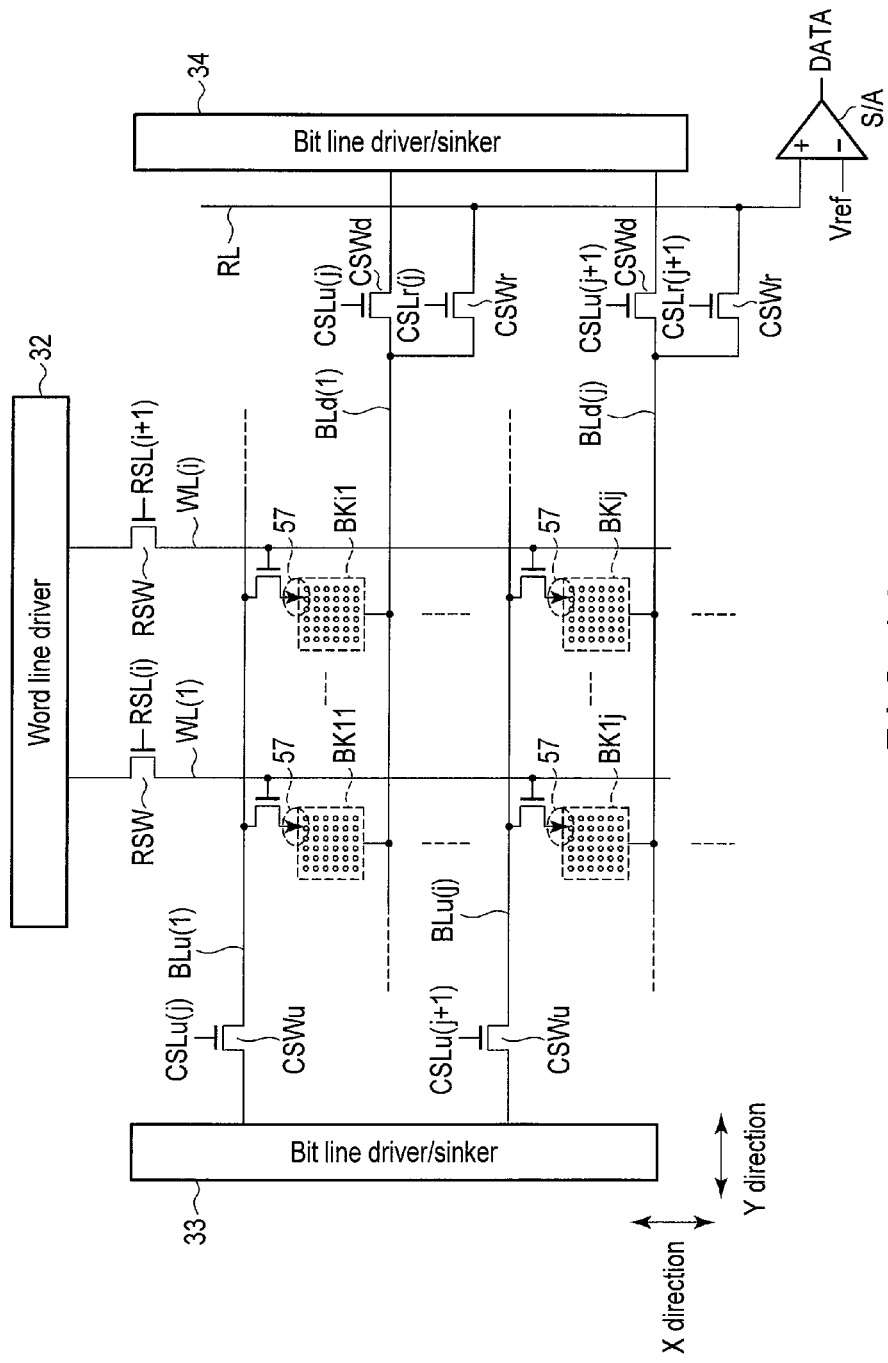
F I G. 40

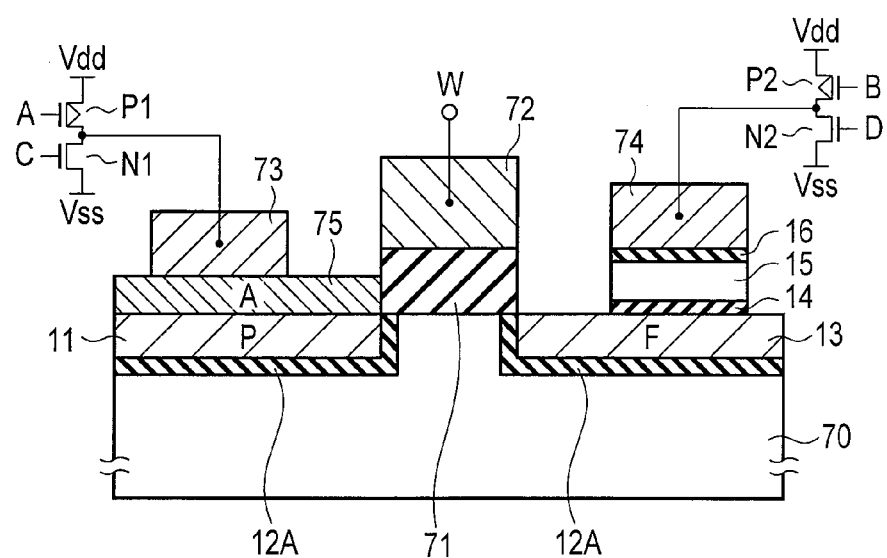
F I G. 42

MAGNETORESISTIVE ELEMENT AND WRITING METHOD OF MAGNETIC MEMORY

CROSS-REFERENCE TO RELATED APPLICATIONS

This application is based upon and claims the benefit of priority from Japanese Patent Application No. 2012-066346, filed Mar. 22, 2012, the entire contents of which are incorporated herein by reference.

FIELD

Embodiments described herein relate generally to a magnetoresistive element having a charge storage layer and a writing method of a magnetic memory including the magnetoresistive element.

BACKGROUND

There has been a growing interest in a magnetic random access memory (MRAM) using the magnetoresistance effect of a ferromagnetic body as a next-generation solid-state non-volatile memory capable of performing high-speed reading/writing, large-capacity, and low-power consumption operations.

However, with increasing integration of magneto tunnel junction (MTJ) elements to realize gigabit (GBit)-level MRAM, there arises a problem of an increasing write/erase current necessary to write data to the MTJ element or erase data from the MTJ element. A write/erase current may be denoted simply as a write current below and a write/erase operation may be denoted simply as a write operation.

When heat generated by the write/erase current (hereinafter, referred to as current-carrying heat) is conducted to a non-selected MTJ element, the spin of the non-selected MTJ element is reversed, causing an erroneous write (disturb). Thus, preventing thermal conduction of current-carrying heat to a non-selected cell or reducing the write current as a source thereof is demanded.

Further, if current-carrying heat remains for a long time in a selected cell after a write operation, a problem of a reduced writing speed is caused. Thus, after a write operation is performed, it is necessary to dissipate current-carrying heat from a selected cell as soon as possible.

In recent years, on the other hand, research of MRAM in a write mode that reverses only the magnetization direction of a recording layer of an MTJ element by using heat assistance by the current-carrying heat into a storage cell is conducted.

In conventional MRAM, as described above, there has been a problem of a reduced writing speed due to an occurrence of erroneous writing caused by current-carrying heat.

BRIEF DESCRIPTION OF THE DRAWINGS

FIG. 1 is a sectional view showing a magnetoresistive element according to a first embodiment;

FIG. 4 is a diagram illustrating write and erase operations of the magnetoresistive element of a B type according to the first embodiment;

FIG. 12A is a diagram illustrating the write operation of the magnetoresistive element according to the second embodiment;

FIG. 12B is a diagram illustrating the read operation of the magnetoresistive element according to the second embodiment;

FIGS. 19A and 19B are diagrams illustrating the magnetic reset operation of the magnetoresistive element according to the third embodiment;

FIG. 25 is a sectional view showing the memory cell having the magnetoresistive element according to the fourth embodiment;

FIG. 27 is a circuit diagram showing a magnetic random access memory as an application example of the magnetoresistive element according to each embodiment;

FIG. 34 is a diagram exemplifying a layout of the magnetoresistive element according to each embodiment;

FIG. 35 is a diagram exemplifying the layout of the magnetoresistive element according to each embodiment;

FIG. 40 is a diagram showing a probe memory in a multi-probe structure as an application example of the magnetoresistive element according to each embodiment;

FIG. 42 is a diagram showing a spin FET as an application example of the magnetoresistive element according to each embodiment.

DETAILED DESCRIPTION

Figure 2:
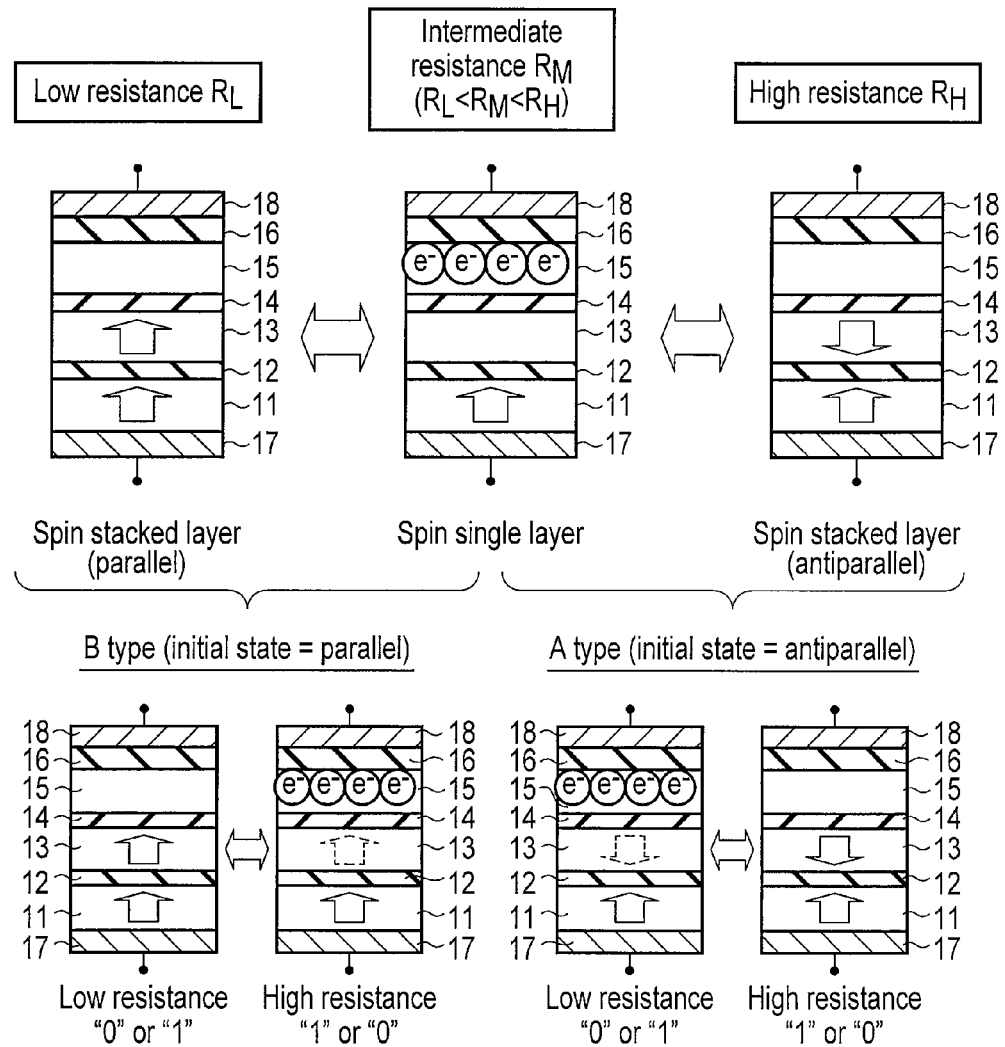
FIG. 2 is a sectional view showing a resistance change state of the magnetoresistive element according to the first embodiment.

In general, according to one embodiment, a magnetoresistive element includes a first magnetic layer, a second magnetic layer, a non-magnetic layer formed between the first and second magnetic layers, a charge storage layer having a first surface and a second surface different from the first surface, the first surface facing the second magnetic layer, a first insulating layer formed between the second magnetic layer and the first surface of the charge storage layer, and a second insulating layer formed on the second surface of the charge storage layer.

[1] Overview

The present embodiments use a phenomenon of the phase transition from a ferromagnetic state to a paramagnetic state by applying a voltage to a magnetic body to change the Curie temperature Tc, instead of using magnetization reversal technology (spin transfer torque magnetization reversal) itself by current direct driving of a conventional magnetic random access memory.

The electric control of magnetic properties is very important for device application in the field of spintronics. The coercive force or anisotropy of magnetism in metal has been, like a semiconductor, electrically controlled, but the electric control of the Curie temperature has been realized only in a low-temperature semiconductor. However, the electric control of the phase transition of a ferromagnetic body at room temperature has been established by using cobalt, which is one of the most representative transition metal ferromagnetic bodies.

The technology to control magnetic properties by applying a voltage to a magnetic body is known as a phenomenon observed at ultralow temperature in a so-called dilute magnetic semiconductor such as (Ga, Mn)As.

Further, such a phenomenon is confirmed also in oxide semiconductors in recent years and also is not limited at ultralow temperature and it is disclosed that, for example, $TiCoO_2$ displays the Curie temperature Tc of 400 [K] or higher.

Based on such a phenomenon, in the present embodiments, a charge storage layer sandwiched between electrically insulating layers is arranged adjacent to a conventional magnetoresistive element. Then, by accumulating charges in the charge storage layer, a state in which a potential is applied to an element is maintained by accumulated charges in the charge storage layer even after the voltage application to the element has ended. Accordingly, the phase transition of a magnetic layer adjacent to the charge storage layer from the ferromagnetic state to the paramagnetic state is caused. In the paramagnetic state, the spin of each atom is oriented in a random direction and spontaneous magnetization disappears, which can be said macroscopically to be a state of no spin in the magnetic layer as a whole. In a paramagnetic state in which the spin in the magnetic layer adjacent to the charge storage layer disappears, the resistance of a magnetoresistive element is different from the resistance when two magnetic layers are parallel or antiparallel.

According to the conventional magnetization reversal technology by current direct driving, as described above, "1" and "0" are defined for the cases when orientations of spins of two magnetic layers are parallel and antiparallel. In the present embodiments, on the other hand, a charge trap assist demagnetizing magnetoresistive memory defining "1" and "0" for the cases when two magnetic layers are parallel or antiparallel and when one of the magnetic layers is in a paramagnetic state in respective states and the spin disappears macroscopically is proposed.

The magnetic permeability in a paramagnetic state is smaller than that in a ferromagnetic state even if a magnetic field is applied to a layer in the paramagnetic state and thus, only magnetization proportional to an external magnetic field is observed. This is very small when compared with a layer in the ferromagnetic state.

The embodiments will be described below with reference to the drawings. In the description, common reference numerals are attached to common elements throughout the drawings.

[2] First Embodiment

[2-1] Structure of Magnetoresistive Element

A magnetoresistive element 10 according to the first embodiment will be described by using FIGS. 1 and 2.

As shown in FIG. 1, the magnetoresistive element 10 includes a reference layer (first magnetic layer) 11, a non-magnetic layer 12, a recording layer (second magnetic layer) 13, a first insulating layer 14, a charge storage layer 15, a second insulating layer 16, a first wiring 17, and a second wiring 18.

The configuration of the reference layer 11, the non-magnetic layer 12, and the recording layer 13 in the magnetoresistive element 10 is similar to that of a conventional magnetoresistive element and is a portion taking charge of resistance changes also in the present embodiment. In the reference layer 11, magnetization is fixed in a direction perpendicular to the film surface. In the recording layer 13, the easy axis of magnetization is in a direction perpendicular to the film surface. The non-magnetic layer 12 is arranged between the reference layer 11 and the recording layer 13. Incidentally, the reference layer 11 is also referred to as, for example, a magnetic reference layer, fixed layer, magnetic fixed layer, fixing layer, pin layer, or pinned layer. The recording layer 13 is also referred to as, for example, a storage layer or free layer. The non-magnetic layer 12 is also referred to as, for example, a tunnel barrier layer or tunnel junction layer.

Further, the magnetoresistive element 10 has the charge storage layer 15 sandwiched between the first insulating layer 14 and the second insulating layer 16 arranged on the side of the recording layer 13. The first insulating layer 14 is arranged in contact with the recording layer 13 and the charge storage layer 15 is facing the recording layer 13 across the first insulating layer 14. The second insulating layer 16 is arranged on a surface of the charge storage layer 15 on the opposite of the surface on which the first insulating layer 14 is provided. In FIG. 1, the first insulating layer 14 is arranged directly in contact with the recording layer 13, but a metallic layer or an insulating layer may further be interposed between the first insulating layer 14 and the recording layer 13.

The first wiring 17 and the second wiring 18 are arranged at both ends of the magnetoresistive element 10. The first wiring 17 and the second wiring 18 are not limited to a wiring and may be, for example, a buffer layer (crystallization control layer), electrode, cap layer, contact, or semiconductor layer and are connected to other elements, circuits or the like.

FIG. 1 shows a case when magnetization, the so-called spin orientations of the reference layer 11 and the recording layer 13 are upward and downward respectively, but a case when both are upward and a case when both are downward are also possible. Further, magnetization of the reference layer 11 and the recording layer 13 is not limited to a film surface vertical type in which magnetization is arranged in a direction perpendicular to the film surface and may be an in-plane magnetization type in which magnetization is arranged in a direction parallel to the film surface.

As shown in FIG. 2, the magnetoresistive element 10 has "1" and "0" defined for two states of a spin stacked layer and a spin single layer. The spin stacked layer means a case when the reference layer 11 and the recording layer 13 are magnetized in parallel or antiparallel and the spin single layer means a case when magnetization (spin) of the recording layer 13 disappears due to charges accumulated in the charge storage layer 15.

In the magnetoresistive element 10 in the spin stacked structure, a case when the reference layer 11 and the recording layer 13 are magnetized in parallel produces a low resistance state $R_L$ and a case when the reference layer 11 and the recording layer 13 are magnetized in antiparallel produces a high resistance state $R_H$. In contrast, the magnetoresistive element 10 in the spin single layer produces an intermediate resistance state $R_M(R_L<R_M<R_H)$ that is higher than the low resistance state $R_L$ and lower than the high resistance state $R_H$.

Using such resistance states, when the initial state is antiparallel magnetization (A type), a case of the spin stacked layer with antiparallel magnetization is defined as a high-resistance state ("1" or "0") and a case of the spin single layer in which the spin in the recording layer 13 disappears is defined as a low-resistance state ("0" or "1"). When the initial state is parallel magnetization (B type), on the other hand, a case of the spin stacked layer with parallel magnetization is defined as a low-resistance state ("0" or "1") and a case of the spin single layer in which the spin in the recording layer 13 disappears is defined as a high-resistance state ("1" or "0").

While, as described above, "1" and "0" are defined for the cases when the reference layer and the recording layer are magnetized in parallel (low resistance state $R_L$) and when the reference layer and the recording layer are magnetized in antiparallel (high resistance state $R_H$) in a conventional magnetoresistive element, "1" and "0" are defined for the cases of a spin stacked layer in which the reference layer 11 and the recording layer 13 are magnetized in parallel or antiparallel (low resistance state $R_L$ or high resistance state $R_H$) and of a spin single layer (intermediate resistance state $R_N$) in the magnetoresistive element 10 according to the present embodiment.

[2-2] Write Operation

Figure 3:
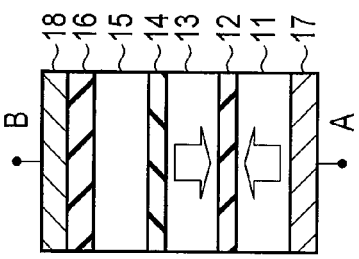
FIG. 3 is a diagram illustrating write and erase operations of the magnetoresistive element of an A type according to the first embodiment.

The method of writing data to the magnetoresistive element 10 will be described by using FIGS. 3 and 4. FIG. 3 shows the A type in which the initial state is an antiparallel magnetization arrangement and FIG. 4 shows the B type in which the initial state is a parallel magnetization arrangement.

[2-2-1] A Type

As shown in FIG. 3, a voltage is applied to the magnetoresistive element 10 by setting the B side to a positive potential and the A side to a negative potential (for example, the ground (GND)) in the magnetoresistive element 10 during write operation. A current flows from the B side toward the A side due to the applied voltage and conversely, a flow of electrons arises from the A side toward the B side. Because a plurality of electric insulators (insulating layers 14, 16) is present between A and B, the rate of the current flowing to the magnetoresistive element 10 is controlled by a so-called tunneling current that tunnels through the plurality of electric insulators.

Also, the Curie temperature Tc of the recording layer 13 in contact with the charge storage layer 15 via the first insulating layer 14 changes due to the applied voltage and also a part of the tunneling current flowing through the magnetoresistive element 10 is accumulated in the charge storage layer 15. Because, as described above, the charge storage layer 15 is sandwiched between the insulating layers 14, 16, the accumulated charges are held in the charge storage layer 15. When no voltage is applied, the band gap of an electric insulator is wide and a so-called potential barrier is high and thus, charges accumulated in the charge storage layer 15 cannot escape. When a voltage is applied, on the other hand, the shape of the potential barrier changes to decrease an apparent potential barrier and charges are injected into the charge storage layer 15 by a so-called FN current.

Then, after the application of voltage to the magnetoresistive element 10 ends, a state in which a potential is applied to the magnetoresistive element 10 is maintained due to charges accumulated in the charge storage layer 15. That is, the Curie temperature Tc of the recording layer 13 changes and a state in which the phase transition from a ferromagnetic state to a paramagnetic state is caused is held to become a spin single state.

Thus, according to the present embodiment, information can be recorded by setting the Curie temperature Tc when no charge is accumulated in the charge storage layer 15 to a device operating temperature or higher and the Curie temperature Tc when a charge is accumulated in the charge storage layer 15 to the device operating temperature or lower to change the magnetic state of the recording layer 13 and to reversibly cause a transition between a magnetized state and a non-magnetized state.

Incidentally, the phenomenon in which the Curie temperature Tc changes by the application of a voltage to a magnetic layer is caused by changes in electron distribution in the magnetic body caused by the application of the voltage.

[2-2-2] B Type

As shown in FIG. 4, a voltage is applied to the magnetoresistive element 10 by setting the B side to a negative potential (for example, the ground (GND)) and the A side to a positive potential in the magnetoresistive element 10 during write operation. A current flows from the A side toward the B side due to the applied voltage and conversely, a flow of electrons arises from the B side toward the A side. Also, the Curie temperature Tc of the recording layer 13 in contact with the charge storage layer 15 via the first insulating layer 14 changes due to the applied voltage and also a part of the tunneling current flowing through the magnetoresistive element 10 is accumulated in the charge storage layer 15.

Then, after the application of voltage to the magnetoresistive element 10 ends, a state in which a potential is applied to the magnetoresistive element 10 is maintained due to charges accumulated in the charge storage layer 15. That is, the Curie temperature Tc of the recording layer 13 changes and a state in which the phase transition from a ferromagnetic state to a paramagnetic state is caused is held to become a spin single state.

[2-3] Erase Operation

Figure 5:
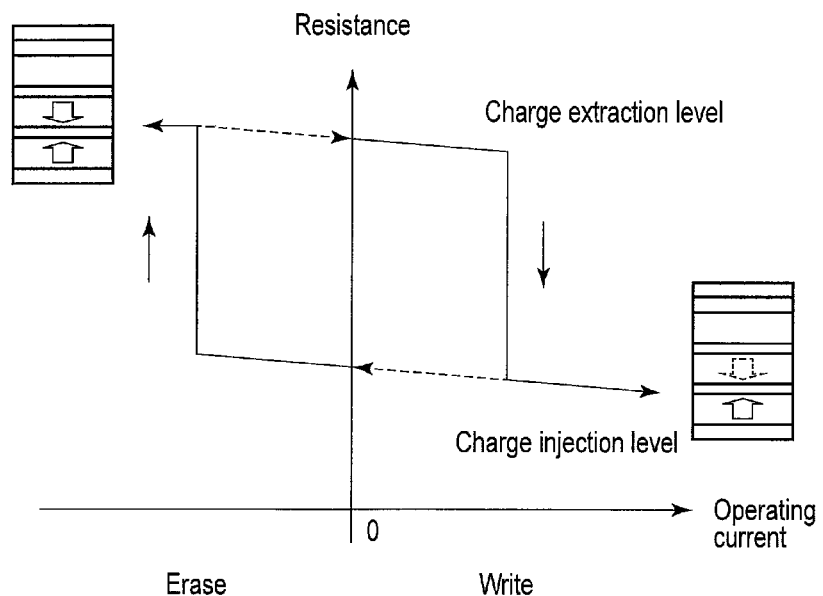
FIG. 5 is a diagram showing resistance changes when written or erased by the magnetoresistive element of the A type according to the first embodiment.

The method of erasing data recorded in the magnetoresistive element 10 will be described by using FIGS. 3 to 5.

[2-3-1] A Type

As shown in FIG. 3, in contrast to during write operation, a voltage is applied to the magnetoresistive element 10 by setting the A side to a positive potential and the B side to a negative potential (for example, the ground (GND)) during erase operation. Accordingly, charges in the charge storage layer 15 are discharged through the adjacent insulating layer 14 due to changes of the potential barrier caused by the applied voltage described above. After charges in the charge storage layer 15 being discharged, the Curie temperature Tc of the recording layer 13 rises to the device operating temperature or higher to return to a ferromagnetic state.

Resistance changes of the magnetoresistive element 10 during erase operation as described above will be described by using FIG. 5. As shown in FIG. 5, charges are injected into the charge storage layer 15 by passing a current in the positive direction during write operation and with the change of the recording layer 13 from a ferromagnetic state to a paramagnetic state, the resistance of the magnetoresistive element 10 decreases. On the other hand, a current is passed in the negative direction during erase operation to extract charges accumulated in the charge storage layer 15 and with the change of the recording layer 13 from a paramagnetic state to a ferromagnetic state, the resistance of the magnetoresistive element 10 increases.

[2-3-2] B Type

As shown in FIG. 4, in contrast to during write operation, a voltage is applied to the magnetoresistive element 10 by setting the A side to a negative potential (for example, the ground (GND)) and the B side to a positive potential during erase operation. Accordingly, charges in the charge storage layer 15 are discharged through the adjacent insulating layer 16 due to changes of the potential barrier caused by the applied voltage described above. After charges in the charge storage layer 15 being discharged, the Curie temperature Tc of the recording layer 13 rises to the device operating temperature or higher to return to a ferromagnetic state.

[2-3-3] Magnetization Arrangement after Erase Operation

In the erase operation according to the present embodiment, as described above, the operation to discharge changes accumulated in the charge storage layer 15 has been described. The recording layer 13 returns to a ferromagnetic state from a paramagnetic state due to the above operation. However, whether the magnetization direction of the recording layer 13 returns to the magnetization arrangement in the initial state depends on an electron current direction passed during erase operation based on spin transfer torque magnetization reversal technology.

In a write operation using the spin transfer torque magnetization reversal technology, information is written by passing spin-polarized electrons in a direction perpendicular to the film surface of the magnetoresistive element to change the magnetization direction of the recording layer 13. Spin-polarized electrons flow in the opposite direction of a spin-polarized current.

More specifically, if a spin-polarized current is passed from the recording layer 13 to the fixed layer 11, spin-polarized electrons are injected into the recording layer 13 and the magnetization direction of the fixed layer 11 and the magnetization direction of the recording layer 13 are arranged in parallel. On the other hand, if a spin-polarized current is passed from the fixed layer 11 to the recording layer 13, spin-polarized electrons flow from the recording layer 13 to the fixed layer 11, electrons having the spin parallel to the fixed layer 11 are transmitted, and electrons having the spin antiparallel to the fixed layer 11 are reflected, resulting in an antiparallel arrangement of the magnetization direction of the recording layer 13 and the magnetization direction of the fixed layer 11.

According to the spin transfer torque magnetization reversal technology described above, when the antiparallel arrangement should be returned as shown in FIG. 3, electrons may be passed from the B side toward the A side during erase operation and when the parallel arrangement should be returned as shown in FIG. 4, electrons may be passed from the A side toward the B side during erase operation.

That is, for an antiparallel arrangement (A type), as shown in FIG. 3, charges in the charge storage layer 15 can be discharged and also the magnetization direction of the recording layer 13 can be reset to the original antiparallel state by passing electrons from the B side toward the A side during erase operation. Similarly, for a parallel arrangement (B type), as shown in FIG. 4, charges in the charge storage layer 15 can be discharged and also the magnetization direction of the recording layer 13 can be reset to the original parallel state by passing electrons from the A side toward the B side during erase operation.

While magnetic resetting of the recording layer 13 has been described, there are some other methods of controlling the orientation of spin of the recording layer 13. Here, the simplest method using a low current and whose operation is simple is shown, which is a method of matching the orientation of spin by using the magnetic field generated by the reference layer 11. This is similar to so-called polarization and the orientation of magnetization of the recording layer 13 can be matched by applying a magnetic field equal to a coercive force Hc of the recording layer 13 or more in a direction perpendicular to the in-plane direction of the film. The orientation of magnetization depends on the orientation of the magnetic field in the position of the recording layer 13 generated by the reference layer 11. If, for example, as shown in FIG. 4, the reference layer 11 is formed of only a film magnetized upward, the recording layer 13 is also magnetized upward.

[2-4] Magnetic Reset Operation

As described above in [2-3-3], charges in the charge storage layer 15 can be discharged and the recording layer 13 can magnetically reset at the same time by passing a current in a predetermined direction between A and B of the magnetoresistive element 10. However, charges in the charge storage layer 15 can be discharged and the recording layer 13 can magnetically reset in separate processes.

Figure 6:
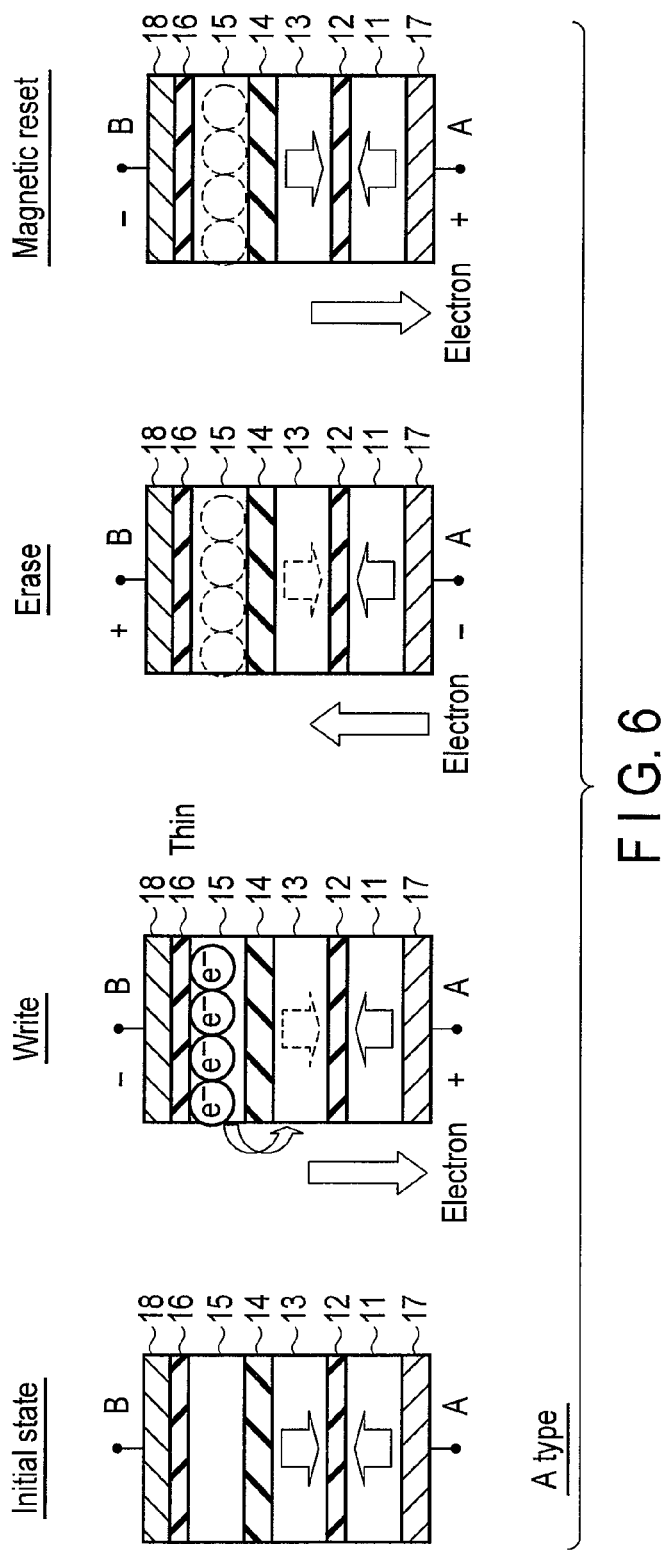
FIG. 6 is a diagram illustrating write, erase, and magnetic reset operations of the magnetoresistive element of the A type according to the first embodiment.

When, for example, as shown in FIG. 6, the initial state is an antiparallel magnetization arrangement (A type), it is assumed that charges are accumulated in the charge storage layer 15 by passing electrons in the direction from B toward A during write operation. In this case, electrons are passed in the direction from A toward B to discharge charges during erase operation. Then, electrons are passed in the direction from B toward A to match the magnetization of the recording layer 13 to the original magnetization state.

Thus, a current may be passed in a first direction to discharge charges of the charge storage layer 15 and then a current may be passed in a second direction (opposite direction of the first direction) to magnetically reset the recording layer 13.

[2-5] Read Operation

The method of reading data recorded in the magnetoresistive element 10 will be described by using FIGS. 7A and 7B.

In a read operation according to the present embodiment, a current is passed in a direction perpendicular to the film surface of the magnetoresistive element 10. The current may be passed from the wiring 17 toward the wiring 18 or from the wiring 18 toward the wiring 17 as the direction to pass the current. Some methods of reading data can be considered and here, data is read by comparing changes of resistance of the magnetoresistive element 10 as the simplest method.

Figures 7A, 7B:
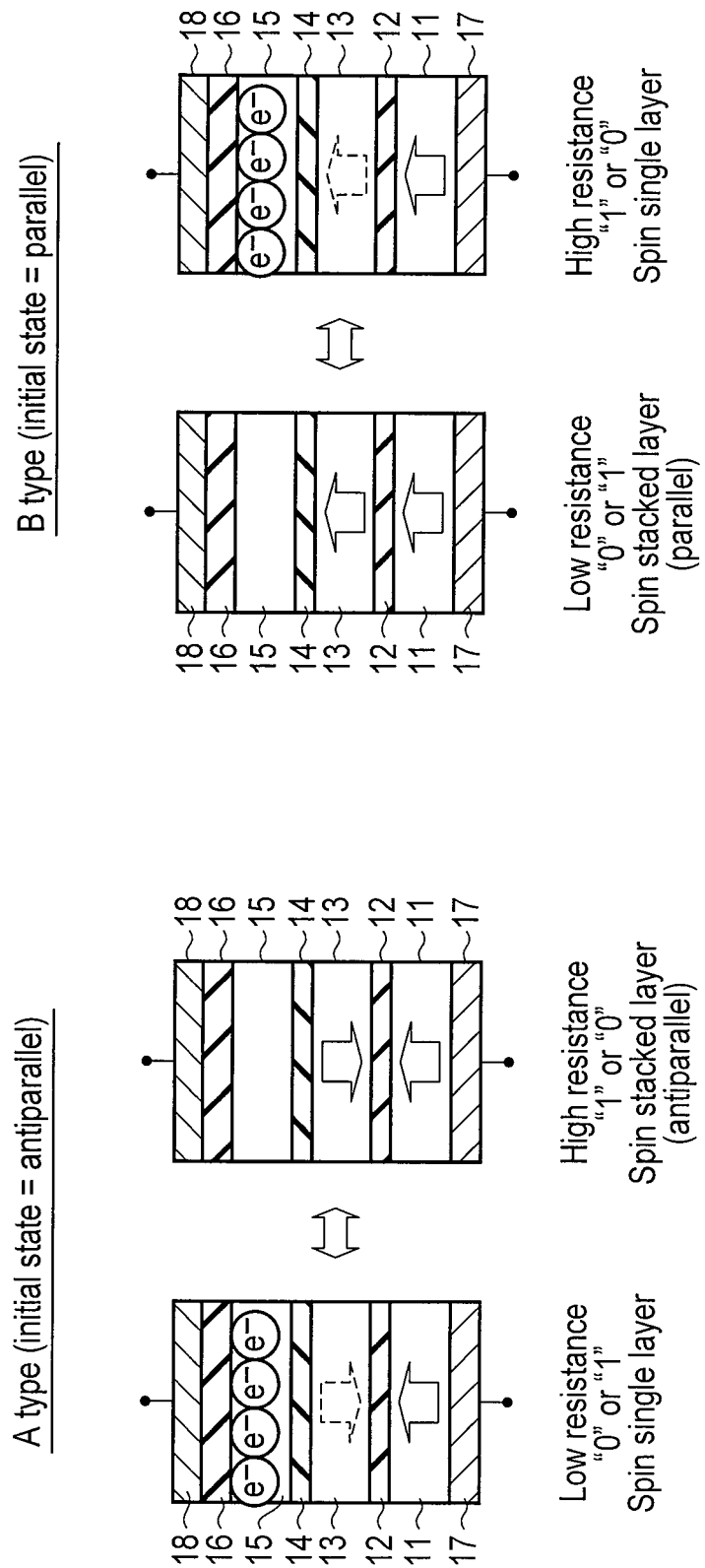
FIGS. 7A and 7B are diagrams illustrating a read operation of the magnetoresistive element according to the first embodiment.

If, as shown in FIG. 7A, the reference layer 11 and the recording layer 13 are in an antiparallel state in which spins of both are oriented in the opposite directions, the magnetoresistive element 10 has a high resistance. When charges are stored in the charge storage layer 15, on the other hand, the recording layer 13 is in a paramagnetic state, which macroscopically has almost no magnetization. In this case, when viewed microscopically, the spin is oriented in random directions and upward spins and downward spins are approximately in equal proportions. Thus, an intermediate resistance between an antiparallel state (high-resistance state) in which spins are oriented in the opposite directions and a parallel state (low-resistance state) in which spins are oriented in the same direction is produced. The resistance when charges are stored in the charge storage layer 15 is lower than when no charge is accumulated and therefore, the spin single layer produces a low resistance state. By detecting a resistance difference, whether data is recorded can be determined.

Similarly, if, as shown in FIG. 7B, the reference layer 11 and the recording layer 13 are in a parallel state in which spins of both are oriented in the same direction, the magnetoresistive element 10 has a low resistance state. When charges are stored in the charge storage layer 15, on the other hand, the recording layer 13 is in a paramagnetic state, which shows an intermediate resistance state between an antiparallel state (high-resistance state) and a parallel state (low-resistance state). The resistance when charges are stored in the charge storage layer 15 is higher than when no charge is accumulated and therefore, the spin single layer produces a high resistance. By detecting a resistance difference, whether data is recorded can be determined.

Though the voltage applied to the magnetoresistive element 10 for reading is small when compared with the voltage for writing/erasing, if the same bit is continuously read for a long time, erroneous writing, so-called read disturb in which charges are accumulated in the charge storage layer 15 also when reading may occur. Therefore, it is desirable to adjust the voltage applied when reading and the time.

[2-6] Material Examples

Material examples to realize the magnetoresistive element 10 according to the present embodiment will be described below. The composition of magnetic layers or non-magnetic layers disclosed below show examples or groups of materials. Elements and devices designed by using these materials have the optimal composition depending on the structure and properties and thus, for example, only the stoichiometric composition may be shown to representatively show the compound name, but materials are not limited to such an example.

[2-6-1] The Reference Layer 11 and the Recording Layer 13

The reference layer 11 and the recording layer 13 is formed of magnetic metals containing at least one element selected from a group of, for example, Fe (iron), Co (cobalt), Ni (nickel), Mn (manganese), and Cr (chromium).

For the recording layer 13, an alloy combining at least one element selected from a group of Fe, Co, Ni, Mn, and Cr and at least one element selected from a group of Pt (platinum), Pd (palladium), Ir (iridium), Ru (ruthenium), and Rh (rhodium) may be used. Accordingly, the value of an anisotropic magnetic field Han of the recording layer 13 increases, which makes it easier to set the value of saturation magnetization Ms of the recording layer 13 to 600 emu/cc or more. The value of the anisotropic magnetic field Han of the recording layer 13 can also be adjusted by the composition of magnetic materials constituting the recording layer 13 and crystal regularities by heat treatment.

The reference layer 11 and the recording layer 13 may also be formed of an alloy containing at least one of Co, Cr, Cu, Fe, Gd, Ir, Mn, Ni, Pd, Pt, Ru, Rh, Tb or a laminated (stacked) film of these elements.

The reference layer 11 and the recording layer 13 may also be formed of an amorphous alloy of rare earth-transition metal such as TbFeCo and GdFeCo, a CoFe or FePt alloy, or a laminated structure of Co/Pt and Fe/Pt.

A magnetic material constituting the reference layer 11 and the recording layer 13 can be a continuous magnetic body or a composite structure in which fine particles formed from a magnetic body are deposited in a matrix shape inside a non-magnetic body. Particularly, the composite structure containing fine particles is suitable for making elements finer and so is preferable for making elements denser. The shape of magnetic fine particles is, for example, cylindrical or spherical.

When an oxide base high-resistance material such as $Al_2O_{3-x}$, $MgO_{1-x}$, $SiO_{2-x}$, $ZnO_x$, and $TiO_y$ ($0<x<1$, $0<y\leq2$) is used for the non-magnetic body regarding a composite structure, crystal control and magnetic anisotropy control of fine particles become easier if the same material as that of the non-magnetic layer 12 is used for the non-magnetic material.

In the first embodiment, for example, a multi-layer film of TbFeCo is used for the reference layer 11 and a laminated film of Co/Pt is used for the recording layer 13.

[2-6-2] Non-Magnetic Layer 12

Two materials of a low-resistance material and a high-resistance material for the non-magnetic layer 12 will be described.

An insulating material as a tunnel barrier layer to obtain increased regenerative signal output due to the TMR (tunnel magnetoresistive) effect for reading can be used for the non-magnetic layer 12. More specifically, the non-magnetic layer 12 can be formed from an oxide, nitride, or fluoride containing at least one element selected from a group of Al (aluminum), Ti (titanium), Zn (zinc), Zr (zirconium), Ta (tantalum), Co (cobalt), Ni (nickel), Si (silicon), Mg (magnesium), and Fe (iron). For example, the non-magnetic layer 12 is an electric insulator and is formed by containing at least one of aluminum oxide ($Al_2O_3$), silicon oxide ($SiO_2$), cobalt oxide (CoO), iron oxide ($Fe_2O_3$), magnesium oxide (MgO), nickel oxide (NiO), tantalum oxide ($Ta_2O_5$), titanium oxide ($TiO_2$), and zinc oxide (ZnO).

Particularly, the non-magnetic layer 12 is preferably formed from a material having a large band gap such as $Al_2O_{3-x}$ (alumina), $MgO_{1-x}$ (magnesium oxide), $SiO_{2-x}$, Si—O—N, Ta—O, Al—Zr—O, $ZnO_x$, and $TiO_y$ or a semiconductor (such as GaAlAs).

Also, increased reproduce signal output can be obtained by forming the non-magnetic layer 12 from a nano-contact MR (magnetoresistive) material in which a magnetic material is inserted into a pinhole provided in an insulator or a CPP (current-perpendicular-to-plane)-CPP-MR material in which Cu is inserted into a pinhole provided in an insulator.

If the non-magnetic layer 12 is a tunnel barrier layer, the thickness thereof is preferably set to the range of 0.2 nm to 2.0 nm to obtain increased reproduce signal output. Similarly, if the non-magnetic layer 12 is formed of a nano-contact MR material, the thickness thereof is preferably set to the range of 0.4 nm to 40 nm to obtain increased reproduce signal output.

In the first embodiment, an MgO crystal whose thickness is 2 nm is used for the non-magnetic layer 12.

[2-6-3] Insulating Layers 14, 16

The first and second insulating layers 14, 16 are formed of silicon oxide ($SiO_2$), aluminum oxide ($Al_2O_3$), a laminated film of silicon oxide ($SiO_2$) and silicon nitride ($Si_3N_4$), or a laminated film of silicon oxide ($SiO_2$), silicon nitride ($Si_3N_4$), and aluminum oxide ($Al_2O_3$).

The simplest configuration is a case when the same material, for example, silicon oxide ($SiO_2$) is used for both of the first and second insulating layers 14, 16. In this case, a thickness difference is provided between the first and second insulating layers 14, 16. When, for example, as shown in FIG. 3, charges are accumulated and discharged by passing through the first magnetic layer 14, the second insulating layer 16 may be made thicker than the first insulating layer 14. When, as shown in FIG. 4, charges are accumulated and discharged by passing through the second magnetic layer 16, the first insulating layer 14 may be made thicker than the second insulating layer 16. Accordingly, the capture efficiency of charge by the charge storage layer 15 can be improved during write operation and electrons supplied by the wiring 17 or the wiring 18 can be inhibited from being captured by the charge storage layer 15 during erase operation and therefore, the efficiency of extracting charges from the charge storage layer 15 can be improved.

Such an effect can be obtained not only by adjusting the thickness difference between the first and second insulating layers 14, 16, but also by selected the material. For example, silicon oxide ($SiO_2$) may be used for the first insulating layer 14 and aluminum oxide ($Al_2O_3$) may be used for the second insulating layer 16. A laminated film of silicon oxide ($SiO_2$) and silicon nitride ($Si_3N_4$) may be used for both of the first and second insulating layers 14, 16 to change the thickness difference thereof. For example, the thickness of the first insulating layer 14 is desirably 5 nm or more and 10 nm or less. The thickness of the second insulating layer 16 is desirably 5 nm or more and 35 nm or less. Further, the equivalence thickness ratio of the first and second insulating layers 14, 16 is desirably 1.1 or more and 1.5 or less. Accordingly, the capture efficiency of charges by the charge storage layer 15 during write operation can further be improved.

In the A type of the first embodiment, silicon oxide ($SiO_2$) whose thickness is 10 nm is used for the first insulating layer 14 and aluminum oxide ($Al_2O_3$) whose thickness is 30 nm is used for the second insulating layer 16.

[2-6-4] Charge Storage Layer 15

Materials having the so-called trap level such as silicon nitride ($Si_3N_4$) and hafnium oxide ($HfO_2$) or semiconductors or conductive materials having no trap level of Si or the like because of a structure similar to that of a floating gate can be used for the charge storage layer 15. The thickness of the charge storage layer 15 is desirably 1 nm or more and 10 nm or less.

In the first embodiment, silicon nitride ($Si_3N_4$) whose thickness is, for example, 10 nm is used for the charge storage layer 15.

[2-7] Manufacturing Method

Samples of the magnetoresistive element 10 according to the present embodiment is manufactured according to the following procedures. The size of an element is 250 nm×250 nm in the in-plane direction of a laminated film described below.

First, the first wiring 17 is formed on a wafer. Then, the wafer is put into an ultra-high vacuum sputter apparatus to successively deposit the reference layer 11, the non-magnetic layer 12, and the recording layer 13 on the first wiring 17. For example, an FePt alignment layer or a buffer layer such as Au (001) and Pt (001) can be used on the first wiring 17. The reference layer 11 formed of a TbFeCo alloy can be made to grow onto, for example, a substrate-heated buffer layer. Then, the substrate temperature is cooled down to room temperature to form an MgO film as the non-magnetic layer 12. A buffer layer of CoFeB or the like or an interface layer can be used between the reference layer 11 and the non-magnetic layer 12 and between the non-magnetic layer 12 and the recording layer 13. Then, an alloy material to form the recording layer 13 is grown in the substrate temperature ranging from 350° C. to 700° C. to obtain the recording layer 13 having desired Ms and Han. Han of the recording layer 13 can be changed by changing the growth temperature of the alloy like this example, but can also be changed by the post-anneal temperature.

Next, the first insulating layer 14, the charge storage layer 15, the second insulating layer 16, and the second wiring 18 are successively deposited on the recording layer 13.

Next, element units are covered by using a mask and the second wiring 18, the second insulating layer 16, the charge storage layer 15, the first insulating layer 14, the recording layer 13, the non-magnetic layer 12, the reference layer 11, and the first wiring 17 are etched by using an ion milling apparatus. The amount of etching can correctly be monitored by introducing sputtered particles into a quadrupole analyzer by differential pumping to perform a mass analysis. The magnetoresistive element 10 is completed by this etching.

Then, the mask is peeled off and further, $SiO_2$ covering the magnetoresistive element 10 completely is formed. After up to the top surface of the second wiring 18 being polished by CMP (chemical mechanical polishing), a wiring layer connected to the second wiring 18 is formed and patterned and further, electrodes are formed, the element is covered with $SiO_2$, and upper and lower electrodes are exposed.

Using samples obtained as described above, resistances before and after changes are accumulated in the charge storage layer 15 by applying a voltage and current in the lamination direction of the magnetoresistive element 10. As a result, resistances of the element before and after charges being accumulated in the charge storage layer 15 are 3e11 [Ω] and 2.5e11 [Ω] respectively. The current density while writing is 0.3 [$A/cm^2$] and in addition to being able to write with a very low current, charges can also be extracted from the charge storage layer 15 during erase operation. When compared with a reversed current of 1e5 [$A/cm^2$] or more in a conventional magnetoresistive element, it is clear that the present embodiment can significantly reduce the current. FIG. 5 illustrates the relationship between the applied current and the resistance in this case.

[2-8] Structure of Memory Cell

Figure 8:
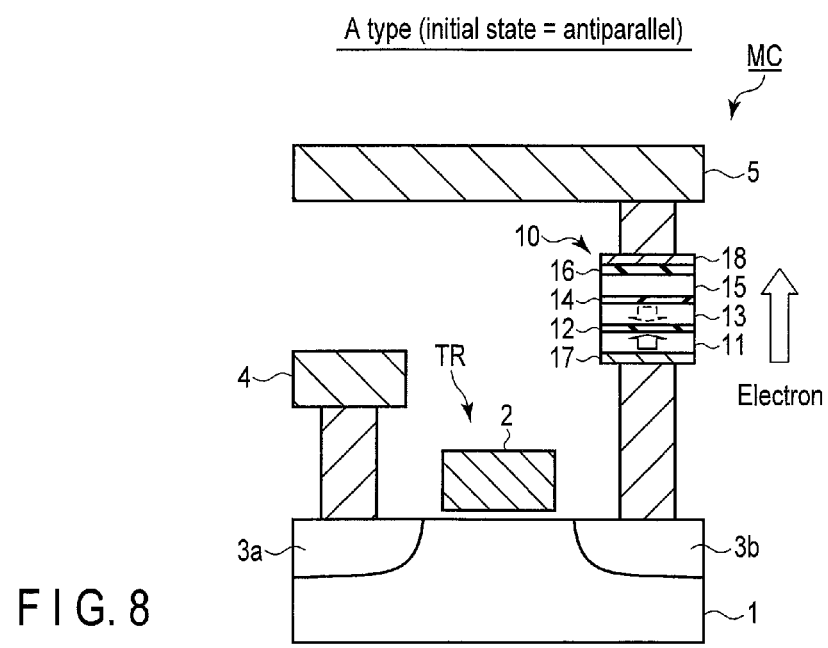
FIG. 8 is a sectional view showing a memory cell having the magnetoresistive element of the A type according to the first embodiment.
Figure 9B:
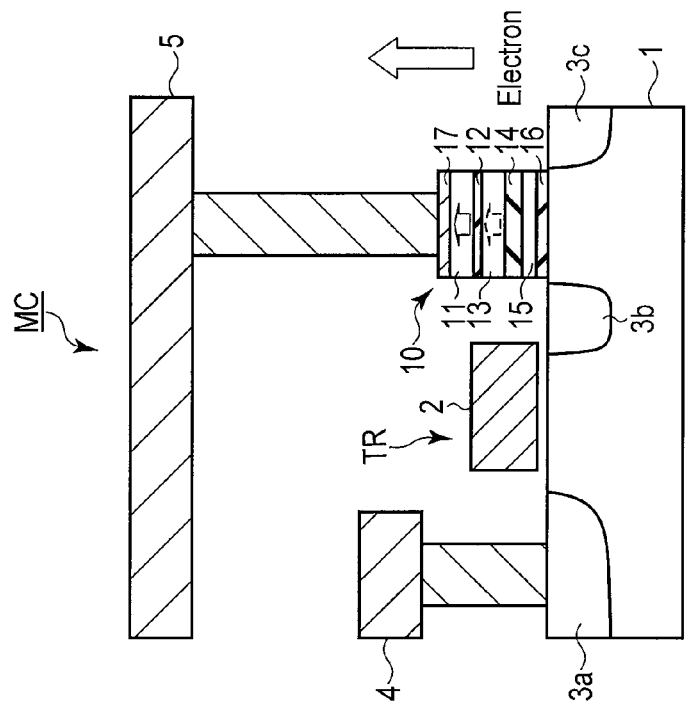
FIGS. 9A and 9B are sectional views showing the memory cell having the magnetoresistive element of the B type according to the first embodiment.

The structure of a memory cell MC containing the magnetoresistive element 10 according to the present embodiment will be described by using FIGS. 8 to 10. FIG. 8 shows the memory cell MC of the magnetoresistive element 10 of the A type (antiparallel magnetization arrangement) shown in FIG. 3 and FIGS. 9A, 9B, and 10 show the memory cell MC of the magnetoresistive element 10 of the B type (parallel magnetization arrangement) shown in FIG. 4. However, the magnetoresistive element 10 of the A type can also be applied to the memory cell MC in FIGS. 9A, 9B, and 10 and the magnetoresistive element 10 of the B type can also be applied to the memory cell MC in FIG. 8.

In the memory cell MC shown in FIG. 8, a gate electrode 2 is formed on a semiconductor substrate 1 and source/drain diffusion layers 3a, 3b are formed on both sides of the gate electrode 2. A wiring 4 is connected to the one source/drain diffusion layer 3a via a contact, the magnetoresistive element 10 is connected to the other source/drain diffusion layer 3b via a contact, and further a wiring 5 is connected via a contact.

Figure 9A:
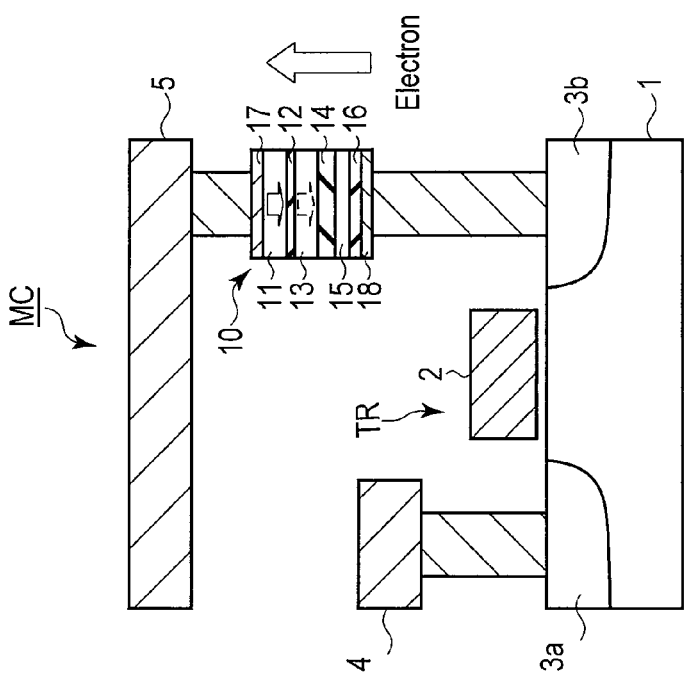
Figure 10:
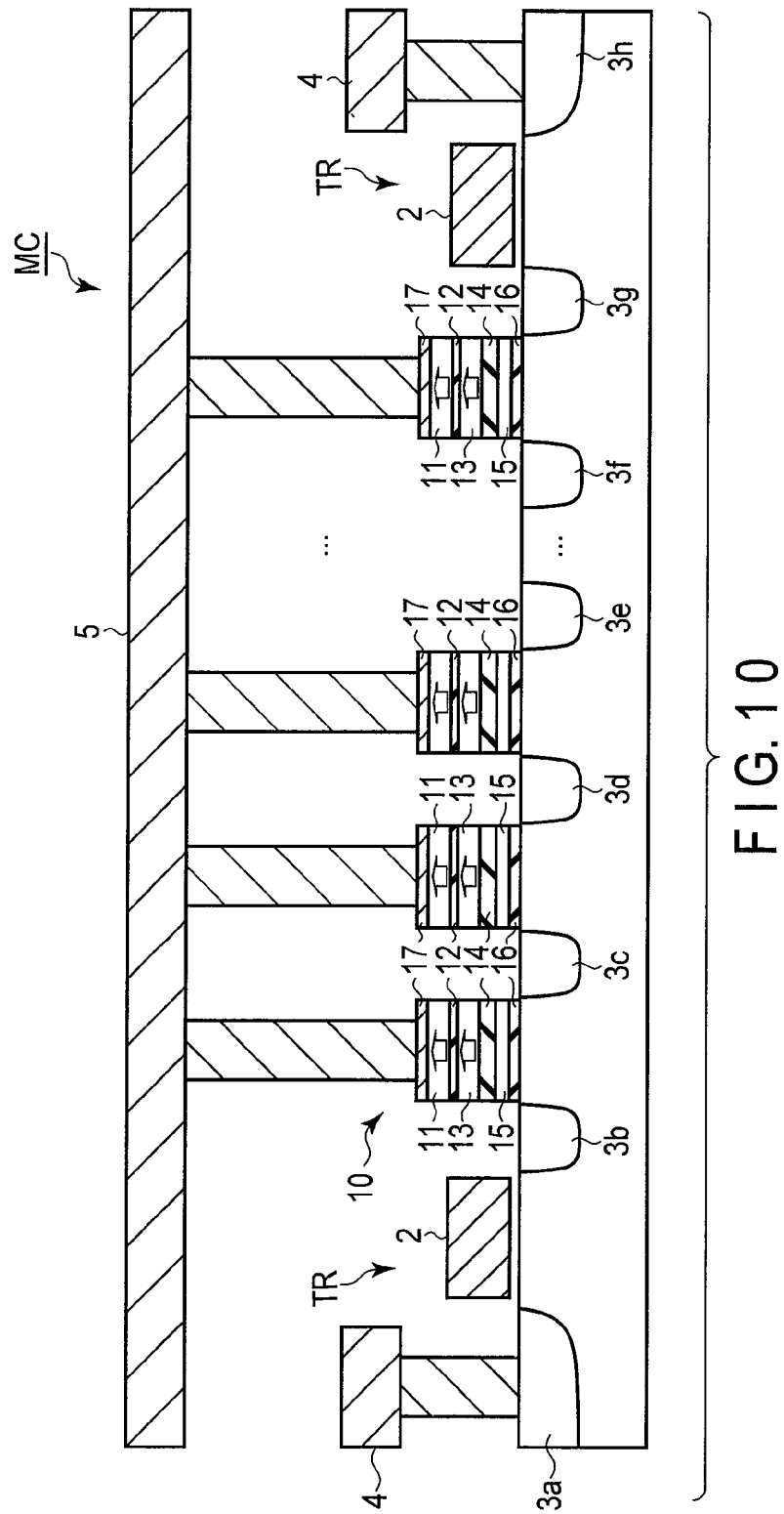
FIG. 10 is a sectional view showing the memory cell having the magnetoresistive element of the B type according to the first embodiment.

The memory cell MC shown in FIG. 9A is different from the memory cell MC in FIG. 8 in that the magnetoresistive element 10 is upside down. That is, while the charge storage layer 15 is arranged above the recording layer 13 in FIG. 8, the charge storage layer 15 is arranged below the recording layer 13 in FIG. 9A.

An advantage of turning the magnetoresistive element 10 upside down in the A type and B type will be described below. In both of the A type in FIG. 8 and the B type in FIG. 9A, electrons are made to flow from the side of the semiconductor substrate 1 toward the magnetoresistive element 10 during write operation. That is, rich carriers generated by the semiconductor substrate 1 can be used by injecting electrons into the charge storage layer 15 of the magnetoresistive element 10 from the side of the semiconductor substrate 1 during write operation.

The memory cell MC shown in FIG. 9B is different from the memory cell MC in FIG. 9A in that the magnetoresistive element 10 is formed directly on the semiconductor substrate 1. In FIG. 9B, the magnetoresistive element 10 is arranged so that the insulating layer 16 is directly in contact with the semiconductor substrate 1 and the diffusion layers 3b, 3c are formed in the semiconductor substrate 1 on both sides of the magnetoresistive element 10. Incidentally, the wiring 18 or the like may be formed between the semiconductor substrate 1 and the insulating layer 16.

The memory cell MC shown in FIG. 10 is configured like a NAND string of a NAND flash memory to seek higher integration of the magnetoresistive element 10. That is, a plurality of the magnetoresistive elements 10 is arranged on the semiconductor substrate 1 and transistors Tr are arranged on both sides of the plurality of the magnetoresistive elements 10. Each of the plurality of the magnetoresistive elements 10 is connected to the wiring 5 via a contact.

[2-9] Effect

According to the first embodiment, the charge storage layer 15 sandwiched between the insulating layers 14, 16 is arranged adjoining the recording layer 13. Then, the charge storage layer 15 is caused to accumulate or discharge charges by applying a current or voltage to the magnetoresistive element 10 during write or erase operation. Then, after the application of current or voltage to the magnetoresistive element 10 ends, a state in which a potential is applied to the magnetoresistive element 10 is maintained due to charges accumulated in the charge storage layer 15 or discharged charges. Accordingly, the phase transition of the recording layer 13 from a ferromagnetic state to a paramagnetic state or from a paramagnetic state to a ferromagnetic state is caused to change the resistance of the magnetoresistive element 10.

Thus, according to the present embodiment, the magnetization state of the recording layer 13 can be changed even after the application of current or voltage to the magnetoresistive element 10 ends by using the accumulation of charges in the charge storage layer 15 or the discharge of charges from the charge storage layer 15. Thus, in the present embodiment, the current for writing or erasing can be reduced. Therefore, in the present embodiment, the occurrence of erroneous writing and degradation in writing speed due to current-carrying heat can be inhibited to achieve lower power consumption. Moreover, the current for writing or erasing can significantly be reduced and thus, smaller current driving performance can be used for transistors around the memory cell and the circuit area can be reduced so that the magnetic memory can be made smaller than before.

[3] Second Embodiment

In the first embodiment described above, a current flows to the charge storage layer 15 during reading just like during writing. In the second embodiment, by contrast, different current paths are used for reading. and writing and to suppress fluctuations of charges in the charge storage layer 15 during reading.

[3-1] Structure of Magnetoresistive Element

A magnetoresistive element 10 according to the second embodiment will be described by using FIGS. 11A and 11B.

Figures 11A, 11B:
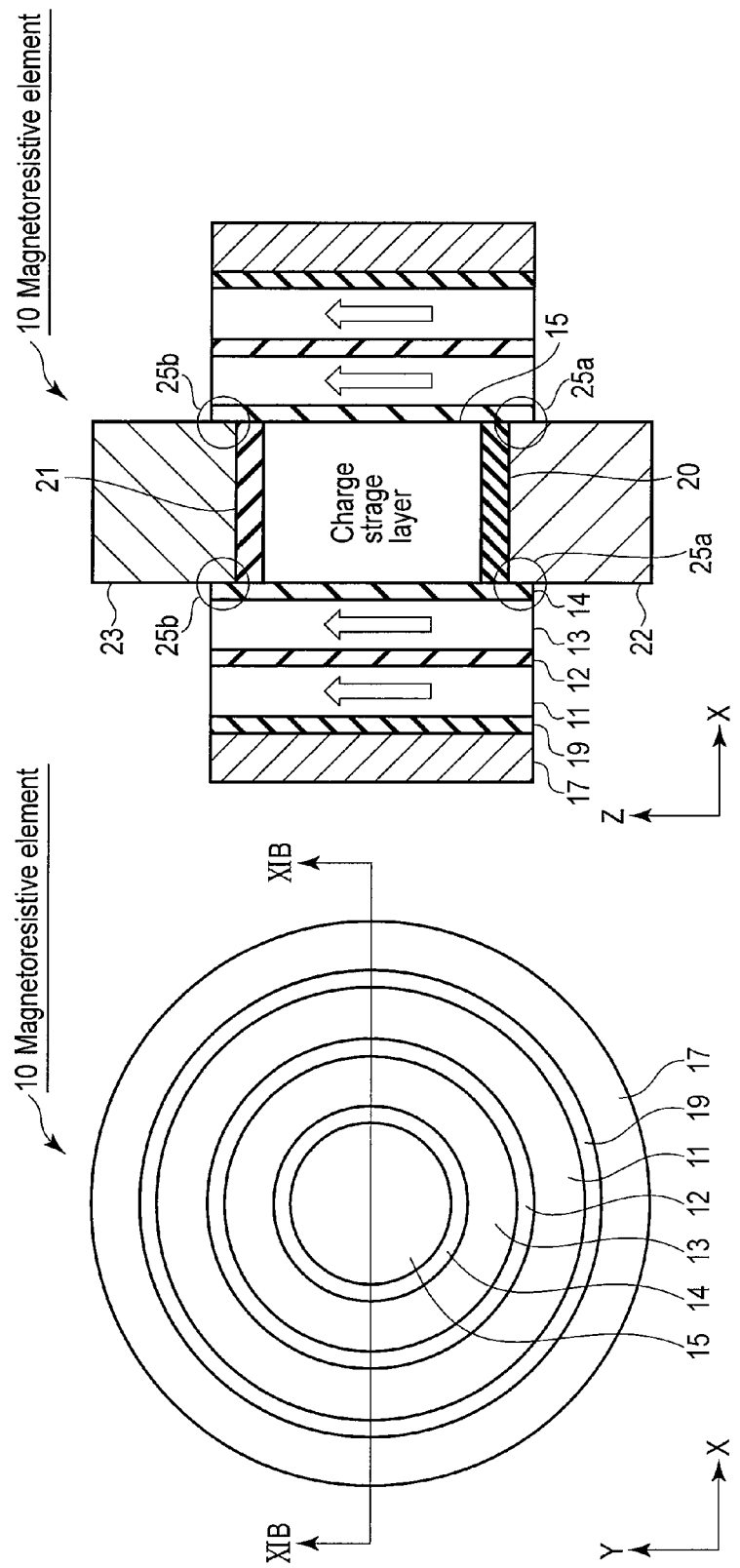
FIG. 11A is a plan view showing a magnetoresistive element according to a second embodiment.
FIG. 11B is a sectional view showing the magnetoresistive element according to the second embodiment.

As shown in FIGS. 11A and 11B, the shape of the magnetoresistive element 10 in the second embodiment is cylindrical. An insulating layer 14, a recording layer 13, a nonmagnetic layer 12, a reference layer 11, an insulating layer 19, and a wiring 17 are successively formed as if to surround the side face of the charge storage layer 15 in a cylindrical shape. Contacts 22, 23 are formed on the undersurface and the top surface of the charge storage layer 15 via insulating layers 20, 21.

The length in a direction (Z direction) parallel to the film surface of the recording layer 13 is longer than the length of the charge storage layer 15 in the Z direction and regions where the recording layer 13 and the charge storage layer 15 are not facing each other, that is, gaps 25a, 25b are formed. A current flows between the contacts 22, 23 and the recording layer 13 due to the gaps 25a, 25b. The gaps 25a, 25b are formed on both of the undersurface and the top surface of the charge storage layer 15, but may also be formed on one of both.

The thickness of the insulating layers 20, 21 may be the same as or different from the thickness of the insulating layer 14. The insulating layer 14 desirably has a thickness that makes it easy to accumulate charges for writing. The insulating layers 20, 21 desirably have a thickness that makes it easy to discharge charges for erasing. The insulating layers 20, 21 may have mutually the same thickness or different thicknesses. If charges are inserted only from the top surface side of the charge storage layer 15 for writing, it is desirable to make the insulating layer 21 thinner than the insulating layer 20. On the other hand, if charges are inserted only from the undersurface side of the charge storage layer 15 for writing, it is desirable to make the insulating layer 20 thinner than the insulating layer 21.

The contacts 22, 23 may be wires, electrodes, conductive layers or the like.

[3-2] Write Operation

The method of writing data to the magnetoresistive element 10 will be described by using FIG. 12A.

As shown in FIG. 12A, a voltage is applied to the magnetoresistive element 10 by setting, for example, the A, C, D sides to 0 V and the B side to 10 V in the magnetoresistive element 10 during write operation. A current flows from the B side toward the A side due to the applied voltage and conversely, a flow of electrons arises from the A side toward the B side. Also, the Curie temperature Tc of the recording layer 13 in contact with the charge storage layer 15 via the insulating layer 14 changes due to the applied voltage and also a part of the tunneling current flowing through the magnetoresistive element 10 is accumulated in the charge storage layer 15.

Then, after the application of voltage to the magnetoresistive element 10 ends, a state in which a potential is applied to the magnetoresistive element 10 is maintained due to charges accumulated in the charge storage layer 15. That is, the Curie temperature Tc of the recording layer 13 changes, a state in which the phase transition from a ferromagnetic state to a paramagnetic state is caused is held, and the spin in the recording layer 13 disappears. Accordingly, the magnetoresistive element 10 changes to a spin single state.

[3-3] Read Operation

The method of reading data recorded in the magnetoresistive element 10 will be described by using FIG. 12B.

As shown in FIG. 12B, a voltage is applied to the magnetoresistive element 10 by setting, for example, the A, B sides to 0 V and the C, D sides to 10 V. Accordingly, electrons flow from the A side toward the C, D sides by passing through the gap 25a due to the applied voltage and electrons flow from the B side toward the C, D sides by passing through the gap 25b. That is, no current flows to the charge storage layer 15 during reading.

In such a read operation, a low-resistance state is produced in a parallel state in which spins in the reference layer 11 and the recording layer 13 are oriented in the same direction. On the other hand, a high-resistance state is produced if charges are stored in the charge storage layer 15 and the spin in the recording layer 13 disappears to form a spin single layer. By detecting a resistance difference, whether data is recorded can be determined.

Incidentally, the direction in which a current is passed for reading may be reversed. That is, electrons may be passed from the C, D sides to the A side by passing through the gap 25a and electrons may be passed from the C, D sides to the B side by passing through the gap 25b.

[3-4] Erase Operation

The method of erasing data recorded in the magnetoresistive element 10 will be described by using FIGS. 13A and 13B.

Figure 13A:
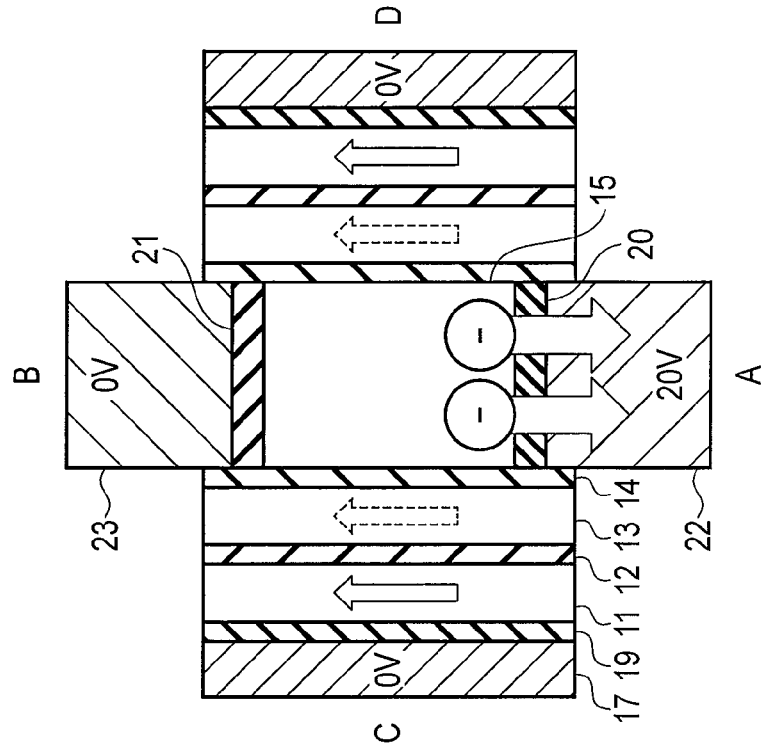
FIG. 13A is a diagram illustrating the erase operation of Erase Example 1 of the magnetoresistive element according to the second embodiment.

In Erase Example 1, as shown in FIG. 13A, a voltage is applied to the magnetoresistive element 10 by setting, for example, the A, B sides to 20 V and the C, D sides to 0 V. Accordingly, charges in the charge storage layer 15 are discharged by passing through the insulating layers 20, 21 adjacent to the charge storage layer 15 due to changes of the potential barrier caused by the applied voltage.

Figure 13B:
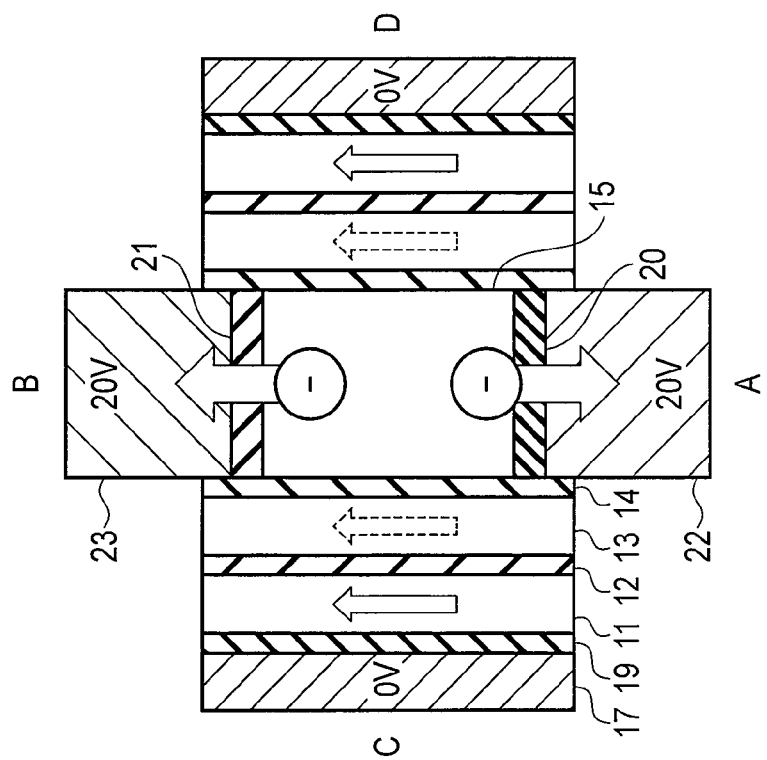
FIG. 13B is a diagram illustrating the erase operation of Erase Example 2 of the magnetoresistive element according to the second embodiment.

In Erase Example 2, as shown in FIG. 13B, a voltage is applied to the magnetoresistive element 10 by setting, for example, the A side to 20 V and the B, C, D sides to 0 V. Accordingly, charges in the charge storage layer 15 are discharged by passing through the insulating layer 20 adjacent to the charge storage layer 15 due to changes of the potential barrier caused by the applied voltage.

After charges in the charge storage layer 15 being discharged as described above, the Curie temperature Tc of the recording layer 13 rises to the device operating temperature or higher to return to a ferromagnetic state.

[3-5] Magnetic Reset Operation

The method of resetting the magnetization direction of the recording layer 13 of the magnetoresistive element 10 will be described by using FIGS. 14A and 14B.

Figure 14B:
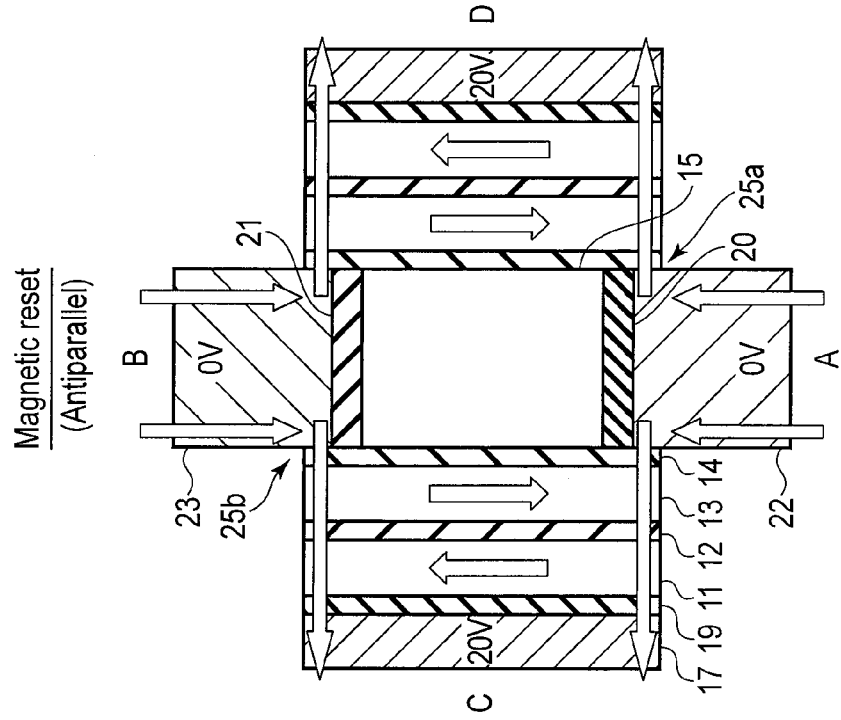
FIGS. 14A and 14B are diagrams illustrating the magnetic reset operation of the magnetoresistive element according to the second embodiment.
Figure 14A:
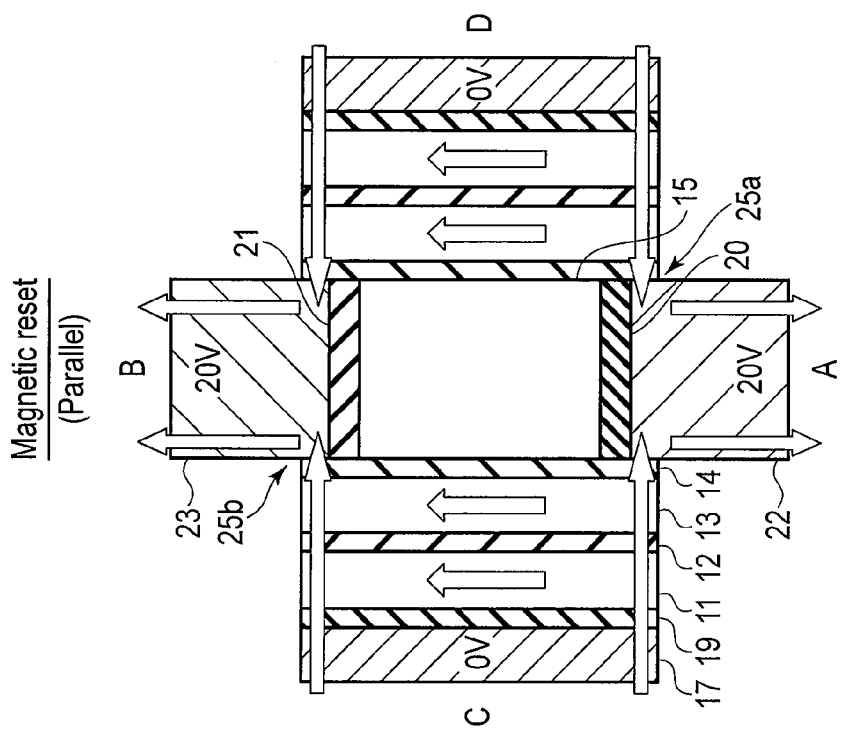

If the parallel magnetization arrangement is adopted for a magnetic reset, as shown in FIG. 14A, a voltage is applied to the magnetoresistive element 10 by setting, for example, the A, B sides to 20 V and the C, D sides to 0 V. Accordingly, electrons flow from the C, D sides toward the A side by passing through the gap 25a due to the applied voltage and electrons flow from the C, D sides toward the B side by passing through the gap 25b. Accordingly, the magnetization direction of the recording layer 13 is matched to the magnetization direction of the reference layer 11 so that the magnetization of the recording layer 13 and the magnetization of the reference layer 11 are arranged in parallel.

If the antiparallel magnetization arrangement is adopted for a magnetic reset, as shown in FIG. 14B, a voltage is applied to the magnetoresistive element 10 by setting, for example, the A, B sides to 0 V and the C, D sides to 20 V. Accordingly, electrons flow from the A side toward the C, D sides by passing through the gap 25a due to the applied voltage and electrons flow from the B side toward the C, D sides by passing through the gap 25b. Accordingly, the magnetization of the recording layer 13 and the magnetization of the reference layer 11 are oriented in the opposite directions so that the recording layer 13 and the reference layer 11 are arranged in antiparallel.

When, like in Erase Example 2 described above, a current flows in one direction between A and B during erase operation, the magnetization of the recording layer 13 can be matched in one direction by applying the magnetic field generated by the current. In such a case, the magnetic reset operation may be omitted.

[3-6] Structure of Memory Cell

The structure of a memory cell MC containing the magnetoresistive element 10 according to the present embodiment will be described by using FIG. 15.

Figure 15:
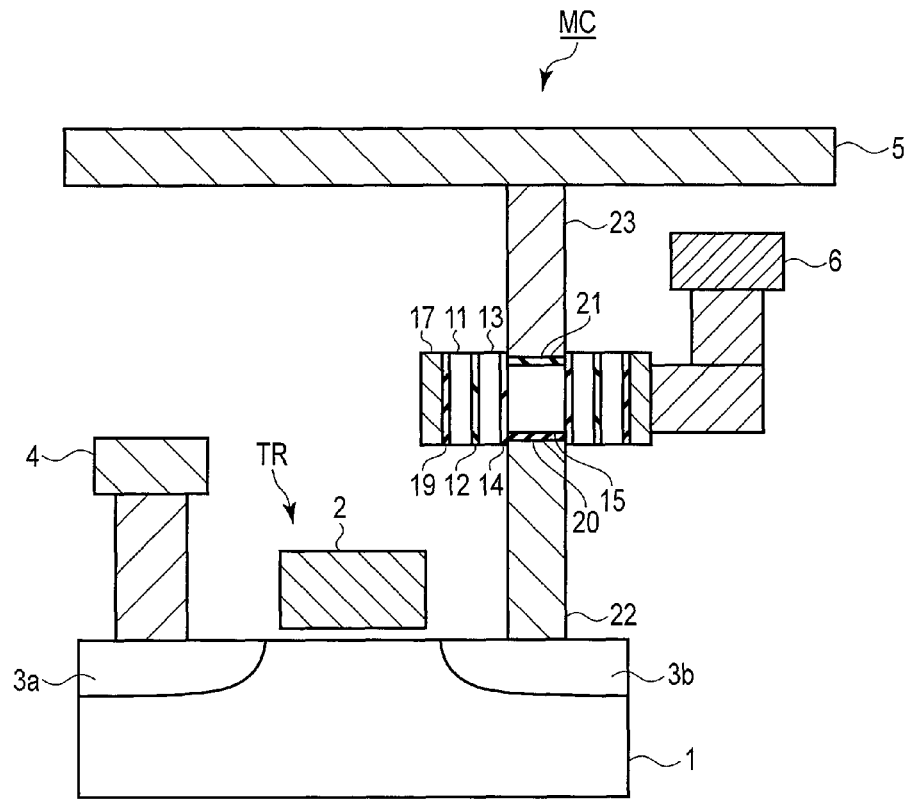
FIG. 15 is a sectional view showing the memory cell having the magnetoresistive element according to the second embodiment.

As shown in FIG. 15, a gate electrode 2 is formed on a semiconductor substrate 1 and source/drain diffusion layers 3a, 3b are formed on both sides of the gate electrode 2. A wiring 4 is connected to the one source/drain diffusion layer 3a via a contact, the magnetoresistive element 10 is connected to the other source/drain diffusion layer 3b via the contact 22, and further a wiring 5 is connected via the contact 23. Also, a wiring 6 is connected to the wiring 17.

[3-7] Effect

According to the second embodiment, effects similar to those of the first embodiment can be obtained.

Further, according to the second embodiment, a current is passed in a direction for reading that is different from the direction for writing so that no current flows to the charge storage layer 15. Accordingly, the amount of charge of the charge storage layer 15 can be prevented from changing during read operation. Further, the insulating layers 14, 20, 21 separating the charge storage layer 15 can be inhibited from undergoing stress so that the charge holding power of the charge storage layer 15 can be improved.

[4] Third Embodiment

Like the second embodiment, the third embodiment is an example in which a charge storage layer 15 is embedded in a semiconductor substrate 1 to pass currents for reading and for writing in different directions.

[4-1] Structure of Magnetoresistive Element

A magnetoresistive element 10 according to the third embodiment will be described by using FIG. 16.

Figure 16:
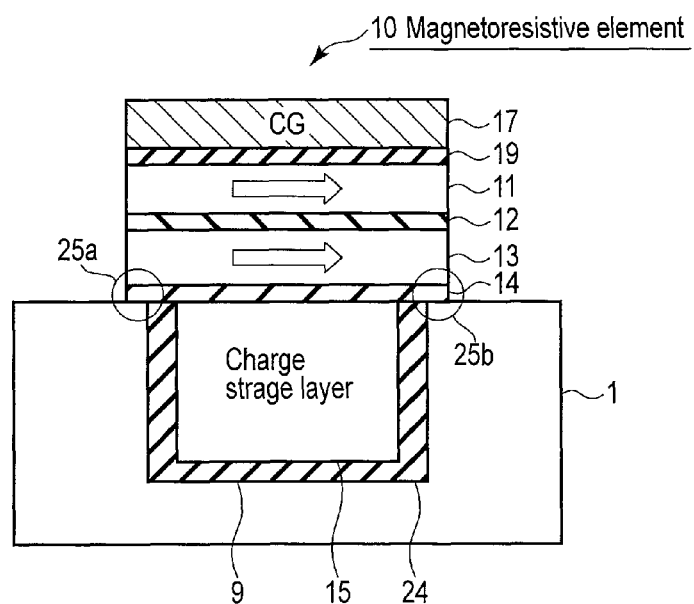
FIG. 16 is a sectional view showing a magnetoresistive element according to a third embodiment.

As shown in FIG. 16, the magnetoresistive element 10 according to the third embodiment has a groove 9 formed inside the semiconductor substrate 1 and the charge storage layer 15 is embedded in the groove 9 via an insulating layer 24. An insulating layer 14, a recording layer 13, a non-magnetic layer 12, a reference layer 11, an insulating layer 19, and a wiring 17 are successively stacked on the semiconductor substrate 1 and the charge storage layer 15. The stacked portion formed from the insulating layer 14, the recording layer 13, the non-magnetic layer 12, the reference layer 11, the insulating layer 19, and the wiring 17 is formed larger than the charge storage layer 15. The length in a direction parallel to the film surface of the recording layer 13 is longer than the length of the charge storage layer 15 and gaps 25a, 25b where the recording layer 13 and the charge storage layer 15 are not facing each other are formed at a lower end of the stacked portion.

[4-2] Write Operation

The method of writing data to the magnetoresistive element 10 will be described by using FIG. 17A.

Figure 17B:
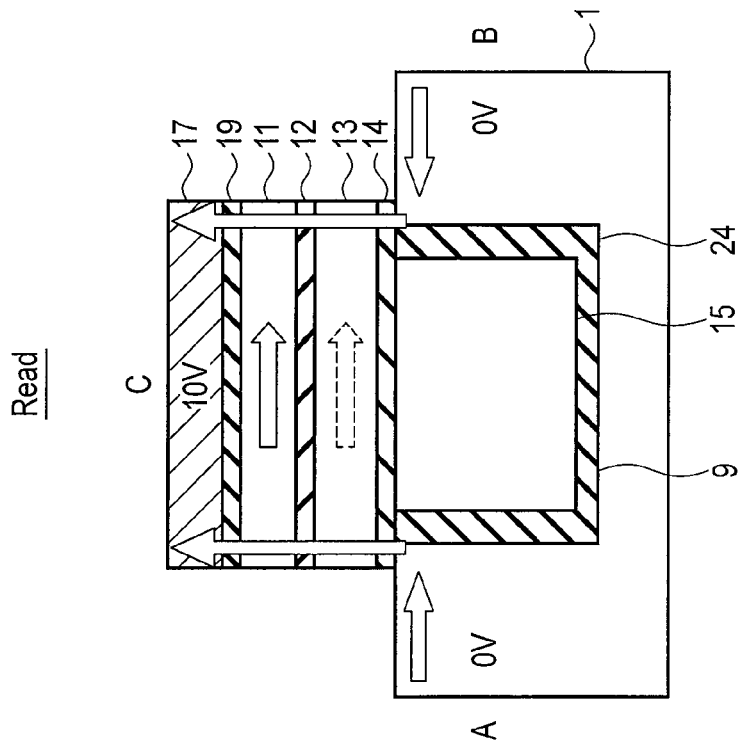
FIG. 17B is a diagram illustrating the read operation of the magnetoresistive element according to the third embodiment.
Figure 17A:
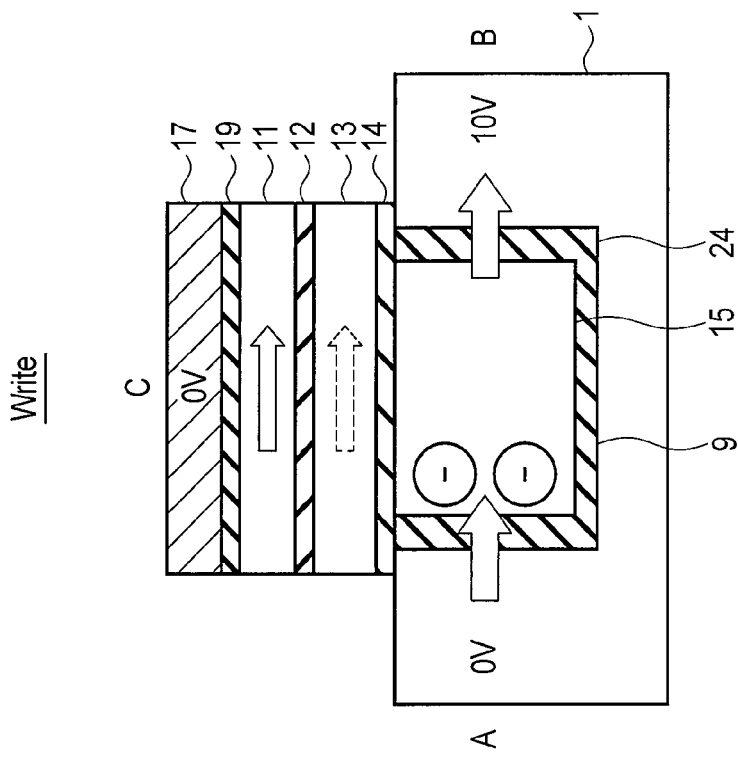
FIG. 17A is a diagram illustrating the write operation of the magnetoresistive element according to the third embodiment.

As shown in FIG. 17A, a voltage is applied to the magnetoresistive element 10 by setting, for example, the A, C sides to 0 V and the B side to 10 V in the magnetoresistive element 10 during write operation. A current flows from the B side toward the A side due to the applied voltage due to the applied voltage and conversely, a flow of electrons arises from the A side toward the B side. Also, the Curie temperature Tc of the recording layer 13 in contact with the charge storage layer 15 via the first insulating layer 14 changes due to the applied voltage and also a part of the tunneling current flowing through the magnetoresistive element 10 is accumulated in the charge storage layer 15.

Then, after the application of voltage to the magnetoresistive element 10 ends, a state in which a potential is applied to the magnetoresistive element 10 is maintained due to charges accumulated in the charge storage layer 15. That is, the Curie temperature Tc of the recording layer 13 changes, a state in which the phase transition from a ferromagnetic state to a paramagnetic state is caused is held, and the spin in the recording layer 13 disappears. Accordingly, the magnetoresistive element 10 changes to a spin single state.

[4-3] Read Operation

The method of reading data recorded in the magnetoresistive element 10 will be described by using FIG. 17B.

As shown in FIG. 17B, a voltage is applied to the magnetoresistive element 10 by setting, for example, the A, B sides to 0 V and the C side to 10 V. Accordingly, electrons flow from the A, B sides toward the C side by passing through the gaps 25a, 25b due to the applied voltage. That is, no current flows to the charge storage layer 15 during reading.

In such a read operation, a low-resistance state is produced in a parallel state in which spins in the reference layer 11 and the recording layer 13 are oriented in the same direction. On the other hand, a high-resistance state is produced if charges are stored in the charge storage layer 15 and the spin in the recording layer 13 disappears to form a spin single layer. By detecting a resistance difference, whether data is recorded can be determined.

Incidentally, the direction in which a current is passed for reading may be reversed. That is, electrons may be passed from the C side toward the A, B sides through the gaps 25a, 25b.

[4-4] Erase Operation

The method of erasing data recorded in the magnetoresistive element 10 will be described by using FIGS. 18A and 18B.

Figure 18B:
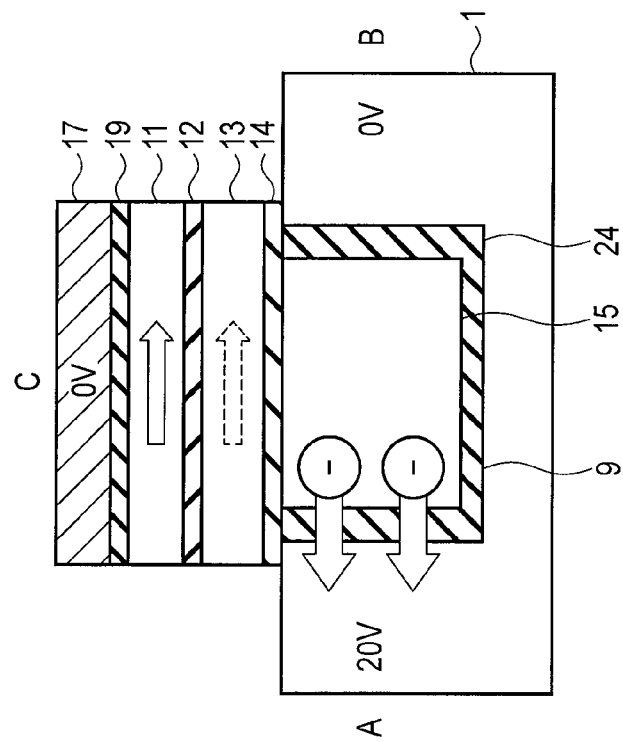
FIG. 18B is a diagram illustrating the erase operation of Erase Example 2 of the magnetoresistive element according to the third embodiment.
Figure 18A:
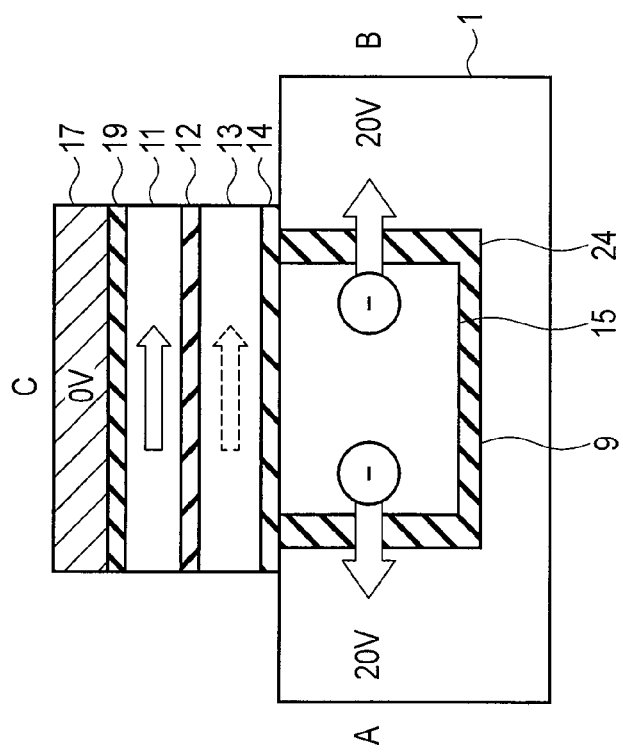
FIG. 18A is a diagram illustrating the erase operation of Erase Example 1 of the magnetoresistive element according to the third embodiment.

In Erase Example 1, as shown in FIG. 18A, a voltage is applied to the magnetoresistive element 10 by setting, for example, the A, B sides to 20 V and the C side to 0 V. Accordingly, charges in the charge storage layer 15 are discharged by passing through the insulating layer 24 adjacent to the charge storage layer 15 due to changes of the potential barrier caused by the applied voltage.

In Erase Example 2, as shown in FIG. 18B, a voltage is applied to the magnetoresistive element 10 by setting, for example, the A side to 20 V and the B, C sides to 0 V. Accordingly, charges in the charge storage layer 15 are discharged by passing through the insulating layer 24 adjacent to the charge storage layer 15 due to changes of the potential barrier caused by the applied voltage.

After charges in the charge storage layer 15 being discharged as described above, the Curie temperature Tc of the recording layer 13 rises to the device operating temperature or higher to return to a ferromagnetic state.

[4-5] Magnetic Reset Operation

The method of resetting the magnetization direction of the recording layer 13 of the magnetoresistive element 10 will be described by using FIGS. 19A and 19B.

If the parallel magnetization arrangement is adopted for a magnetic reset, as shown in FIG. 19A, a voltage is applied to the magnetoresistive element 10 by setting, for example, the A, B sides to 20 V and the C side to 0 V. Accordingly, electrons flow from the C side toward the A, B sides by passing through the gaps 25a, 25b due to the applied voltage. Accordingly, the magnetization direction of the recording layer 13 is matched so that the magnetization of the recording layer 13 and the magnetization of the reference layer 11 are arranged in parallel.

If the antiparallel magnetization arrangement is adopted for a magnetic reset, as shown in FIG. 19B, a voltage is applied to the magnetoresistive element 10 by setting, for example, the A, B sides to 0 V and the C side to 20 V. Accordingly, electrons flow from the A, B sides toward the C side by passing through the gaps 25a, 25b due to the applied voltage. Accordingly, the magnetization direction of the recording layer 13 is matched so that the magnetization of the recording layer 13 and the magnetization of the reference layer 11 are arranged in antiparallel.

When, like in Erase Example 2 described above, a current flows in one direction between A and B during erase operation, the magnetization of the recording layer 13 can be matched in one direction by applying the magnetic field generated by the current. In such a case, the magnetic reset operation may be omitted.

[4-6] Structure of Memory Cell

The structure of a memory cell MC containing the magnetoresistive element 10 according to the present embodiment will be described by using FIG. 20.

Figure 20:
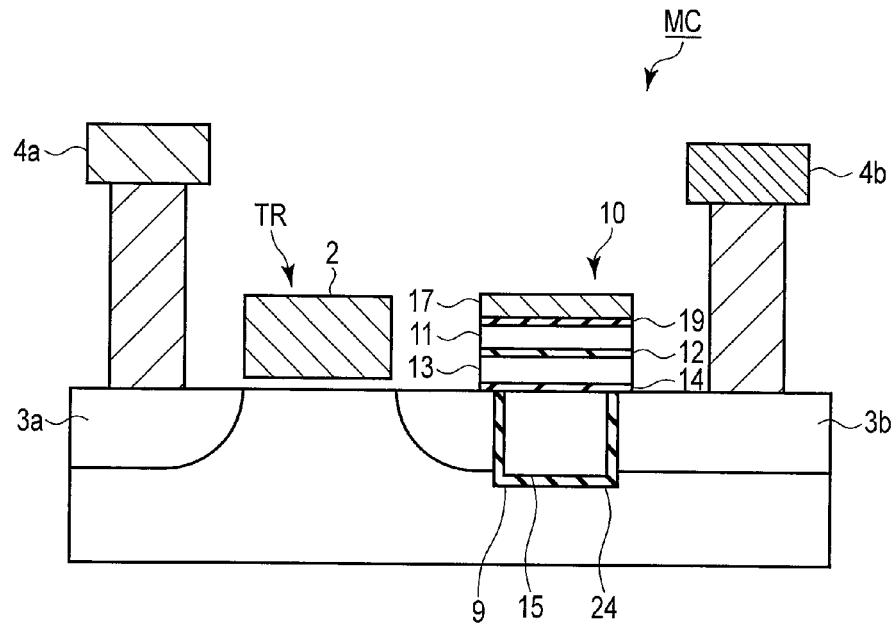
FIG. 20 is a sectional view showing the memory cell having the magnetoresistive element according to the third embodiment.

As shown in FIG. 20, a gate electrode 2 is formed on a semiconductor substrate 1 and source/drain diffusion layers 3a, 3b are formed on both sides of the gate electrode 2. A wiring 4a is connected to the one source/drain diffusion layer 3a via a contact and a wiring 4b is connected to the other source/drain diffusion layer 3b via a contact. Further, the groove 9 is formed inside the semiconductor substrate 1 and the charge storage layer 15 is embedded in the groove 9 via the insulating layer 24. The groove 9 is formed so as to penetrate the source/drain diffusion layer 3b and the undersurface of the charge storage layer 15 is positioned below the undersurface of the source/drain diffusion layer 3b. The insulating layer 14, the recording layer 13, the non-magnetic layer 12, the reference layer 11, the insulating layer 19, and the wiring 17 are successively stacked on the semiconductor substrate 1 and the charge storage layer 15.

[4-7] Effect

According to the third embodiment, effects similar to those of the first and second embodiments can be obtained.

Further, in the third embodiment, the charge storage layer 15 is formed inside the semiconductor substrate 1. Accordingly, it becomes easier to create a structure that can easily store a relatively large amount of charge in a small space and a relatively large current can be passed and therefore, effects of facilitating a high-speed recording, being able to reduce the number of stacked films, and also being able to reduce the aspect ratio of the whole element are also obtained.

[5] Fourth Embodiment

The fourth modification is a modification of the third embodiment and uses an SOI substrate.

[5-1] Structure of Magnetoresistive Element

A magnetoresistive element 10 according to the fourth embodiment will be described by using FIG. 21.

Figure 21:
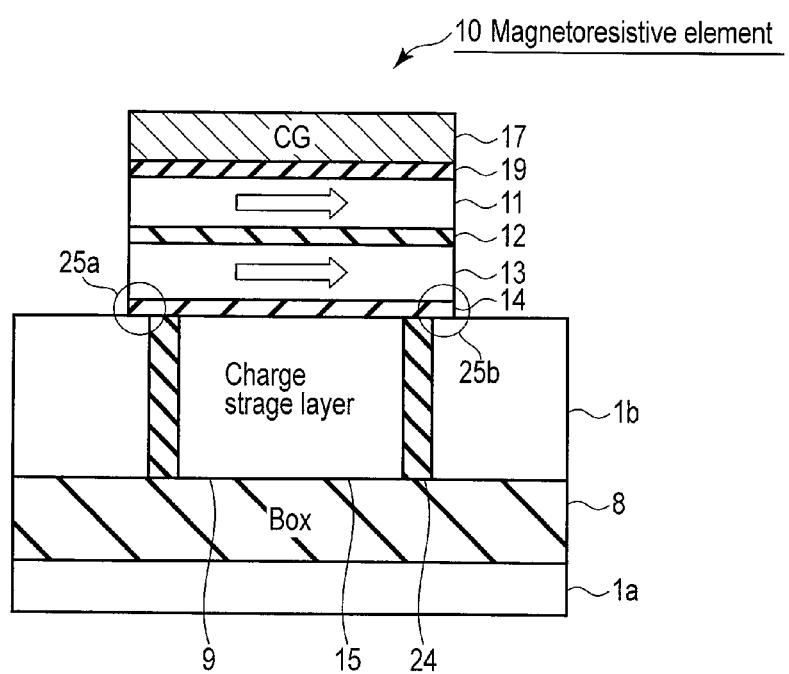
FIG. 21 is a sectional view showing a magnetoresistive element according to a fourth embodiment.

In the fourth embodiment, as shown in FIG. 21, an SOI substrate formed of an embedded insulating layer 8 sandwiched between a semiconductor substrate 1a and a semiconductor layer 1b is used. A groove 9 that exposes the surface of the embedded insulating layer 8 is formed inside the semiconductor layer 1b and a charge storage layer 15 is embedded in the groove 9 via an insulating layer 24.

An insulating layer 14, a recording layer 13, a non-magnetic layer 12, a reference layer 11, an insulating layer 19, and a wiring 17 are successively stacked on the semiconductor layer 1b and the charge storage layer 15. The stacked portion formed from the insulating layer 14, the recording layer 13, the non-magnetic layer 12, the reference layer 11, the insulating layer 19, and the wiring 17 is formed larger than the charge storage layer 15. The length in a direction parallel to the film surface of the recording layer 13 is longer than the length of the charge storage layer 15 and gaps 25a, 25b where the recording layer 13 and the charge storage layer 15 are not facing each other are formed at a lower end of the stacked portion.

[5-2] Write Operation

The method of writing data to the magnetoresistive element 10 will be described by using FIG. 22A.

Figure 22B:
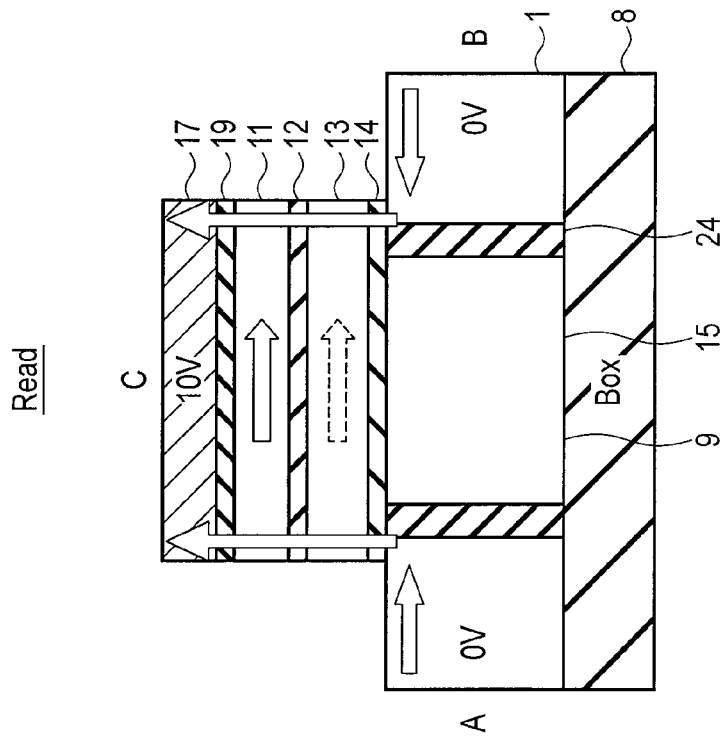
FIG. 22B is a diagram illustrating the read operation of the magnetoresistive element according to the fourth embodiment.
Figure 22A:
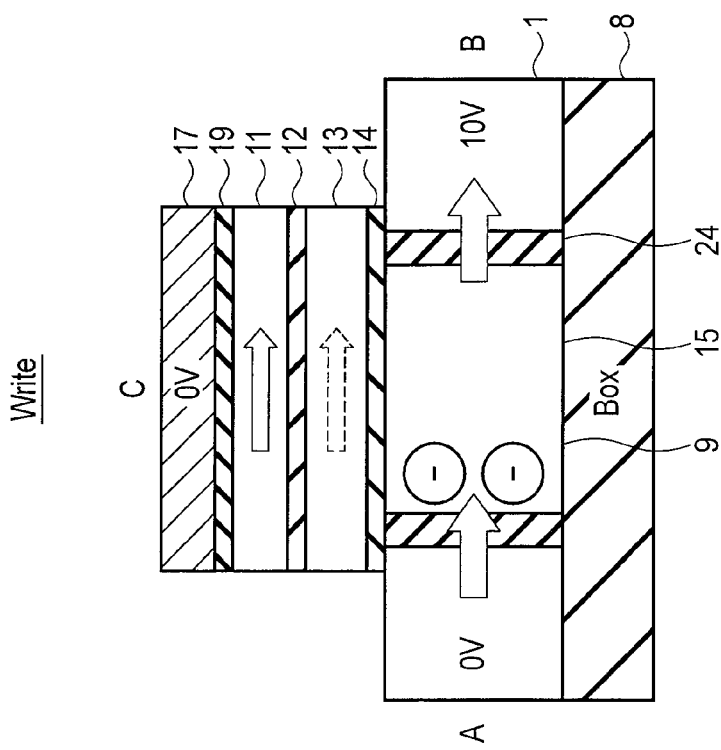
FIG. 22A is a diagram illustrating the write operation of the magnetoresistive element according to the fourth embodiment.

As shown in FIG. 22A, a voltage is applied to the magnetoresistive element 10 by setting, for example, the A, C sides to 0 V and the B side to 10 V in the magnetoresistive element 10 during write operation. A current flows from the B side toward the A side due to the applied voltage and conversely, a flow of electrons arises from the A side toward the B side. Also, the Curie temperature Tc of the recording layer 13 in contact with the charge storage layer 15 via the first insulating layer 14 changes due to the applied voltage and also a part of the tunneling current flowing through the magnetoresistive element 10 is accumulated in the charge storage layer 15.

Then, after the application of voltage to the magnetoresistive element 10 ends, a state in which a potential is applied to the magnetoresistive element 10 is maintained due to charges accumulated in the charge storage layer 15. That is, the Curie temperature Tc of the recording layer 13 changes, a state in which the phase transition from a ferromagnetic state to a paramagnetic state is caused is held, and the spin in the recording layer 13 disappears. Accordingly, the magnetoresistive element 10 changes to a spin single state.

[5-3] Read Operation

The method of reading data recorded in the magnetoresistive element 10 will be described by using FIG. 22B.

As shown in FIG. 22B, a voltage is applied to the magnetoresistive element 10 by setting, for example, the A, B sides to 0 V and the C side to 10 V. Accordingly, electrons flow from the A, B sides toward the C side by passing through the gaps 25a, 25b due to the applied voltage. That is, no current flows to the charge storage layer 15 during reading.

In such a read operation, a low-resistance state is produced in a parallel state in which spins in the reference layer 11 and the recording layer 13 are oriented in the same direction. On the other hand, a high-resistance state is produced if charges are stored in the charge storage layer 15 and the spin in the recording layer 13 disappears to form a spin single layer. By detecting a resistance difference, whether data is recorded can be determined.

Incidentally, the direction in which a current is passed for reading may be reversed. That is, electrons may be passed from the C side toward the A, B sides through the gaps 25a, 25b.

[5-4] Erase Operation

The method of erasing data recorded in the magnetoresistive element 10 will be described by using FIGS. 23A and 23B.

Figure 23A:
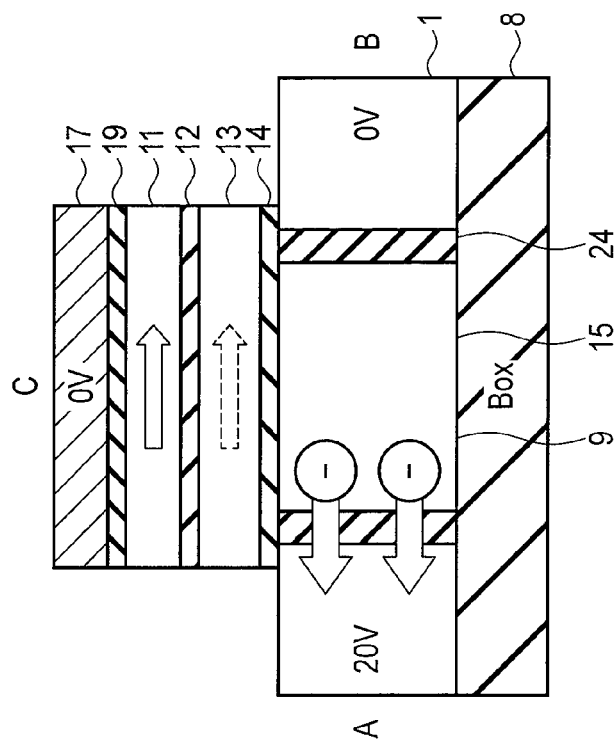
FIG. 23A is a diagram illustrating the erase operation of Erase Example 1 of the magnetoresistive element according to the fourth embodiment.

In Erase Example 1, as shown in FIG. 23A, a voltage is applied to the magnetoresistive element 10 by setting, for example, the A, B sides to 20 V and the C side to 0 V. Accordingly, charges in the charge storage layer 15 are discharged by passing through the insulating layer 24 adjacent to the charge storage layer 15 due to changes of the potential barrier caused by the applied voltage.

Figure 23B:
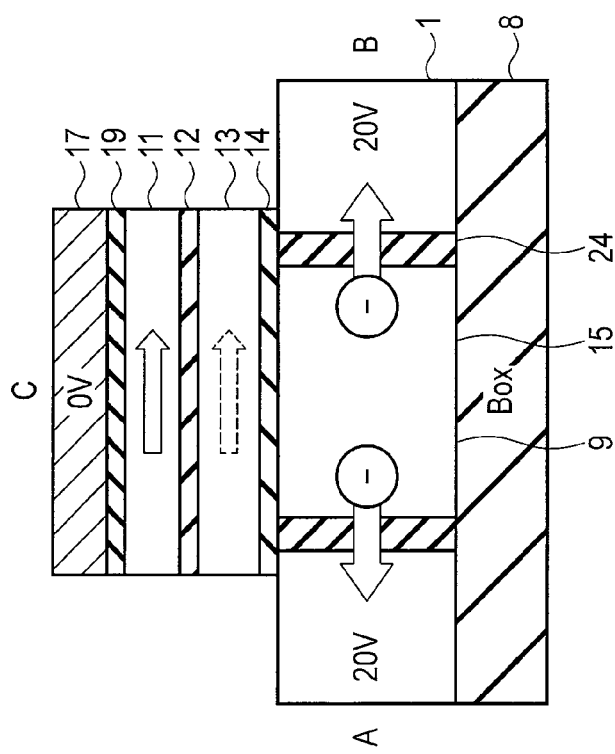
FIG. 23B is a diagram illustrating the erase operation of Erase Example 2 of the magnetoresistive element according to the fourth embodiment.

In Erase Example 2, as shown in FIG. 23B, a voltage is applied to the magnetoresistive element 10 by setting, for example, the A side to 20 V and the B, C sides to 0 V. Accordingly, charges in the charge storage layer 15 are discharged by passing through the insulating layer 24 adjacent to the charge storage layer 15 due to changes of the potential barrier caused by the applied voltage.

After charges in the charge storage layer 15 being discharged as described above, the Curie temperature Tc of the recording layer 13 rises to the device operating temperature or higher to return to a ferromagnetic state.

[5-5] Magnetic Reset Operation

The method of resetting the magnetization direction of the recording layer 13 of the magnetoresistive element 10 will be described by using FIGS. 24A and 24B.

Figure 24A:
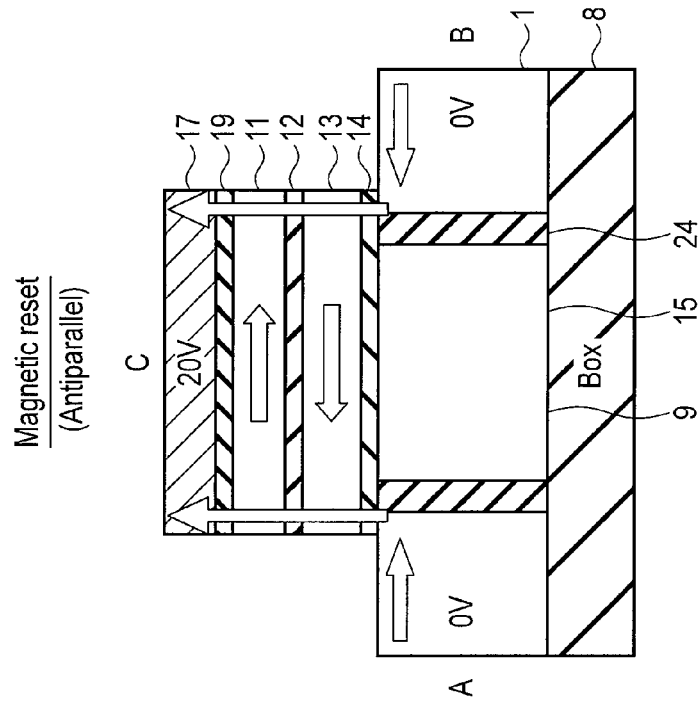
FIGS. 24A and 24B are diagrams illustrating the magnetic reset operation of the magnetoresistive element according to the fourth embodiment.

If the parallel magnetization arrangement is adopted for a magnetic reset, as shown in FIG. 24A, a voltage is applied to the magnetoresistive element 10 by setting, for example, the A, B sides to 20 V and the C side to 0 V. Accordingly, electrons flow from the C side toward the A, B sides by passing through the gaps 25a, 25b due to the applied voltage. Accordingly, the magnetization direction of the recording layer 13 is matched so that the magnetization of the recording layer 13 and the magnetization of the reference layer 11 are arranged in parallel.

Figure 24B:
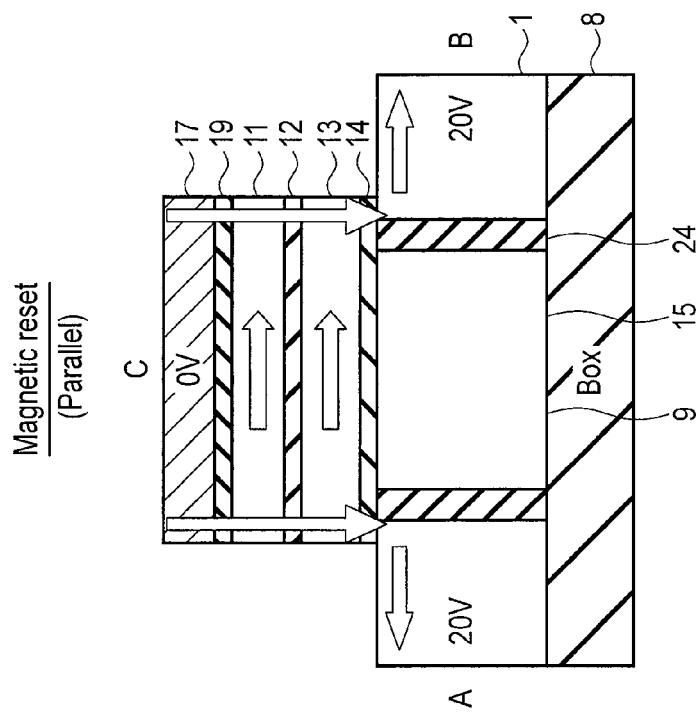

If the antiparallel magnetization arrangement is adopted for a magnetic reset, as shown in FIG. 24B, a voltage is applied to the magnetoresistive element 10 by setting, for example, the A, B sides to 0 V and the C side to 20 V. Accordingly, electrons flow from the A, B sides toward the C side by passing through the gaps 25a, 25b due to the applied voltage. Accordingly, the magnetization direction of the recording layer 13 is matched so that the magnetization of the recording layer 13 and the magnetization of the reference layer 11 are arranged in antiparallel.

When, like in Erase Example 2 described above, a current flows in one direction between A and B during erase operation, the magnetization of the recording layer 13 can be matched in one direction by applying the magnetic field generated by the current. In such a case, the magnetic reset operation may be omitted.

[5-6] Structure of Memory Cell

The structure of a memory cell MC containing the magnetoresistive element 10 according to the present embodiment will be described by using FIG. 25.

As shown in FIG. 25, a gate electrode 2 is formed on a semiconductor substrate 1 and source/drain diffusion layers 3a, 3b are formed on both sides of the gate electrode 2. A wiring 4a is connected to the one source/drain diffusion layer 3a via a contact and a wiring 4b is connected to the other source/drain diffusion layer 3b via a contact. Further, the groove 9 that exposes the embedded insulating layer 8 is formed inside the source/drain diffusion layer 3b and the charge storage layer 15 is embedded in the groove 9 via the insulating layer 24. The insulating layer 14, the recording layer 13, the non-magnetic layer 12, the reference layer 11, the insulating layer 19, and the wiring 17 are successively stacked on the semiconductor substrate 1 and the charge storage layer 15.

[5-7] Effect

According to the fourth embodiment, effects similar to those of the first to third embodiments can be obtained.

Further, the fourth embodiment uses an SOI substrate and the embedded insulating layer 8 is provided below the charge storage layer 15. Therefore, the current can be prevented from passing below the charge storage layer 15 so that charges can more efficiently be stored in the charge storage layer 15.

[6] Other Embodiments

Figure 26A:
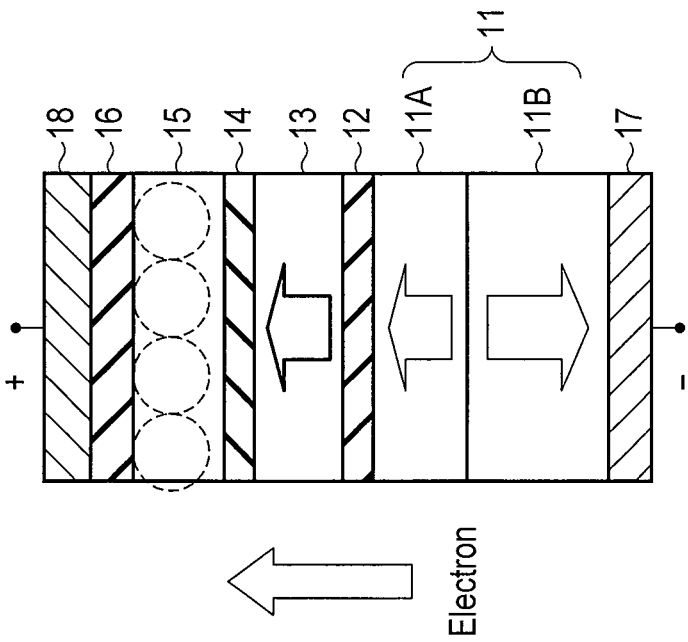
FIGS. 26A and 26B are sectional views showing the magnetoresistive element according to each embodiment.
Figure 26B:
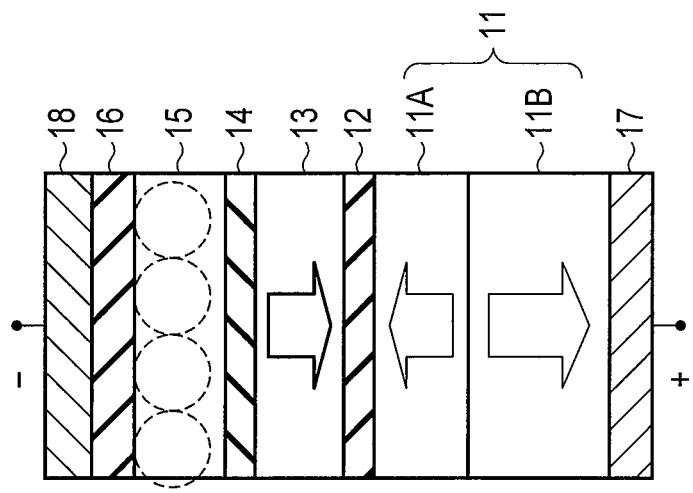
Figure 28:
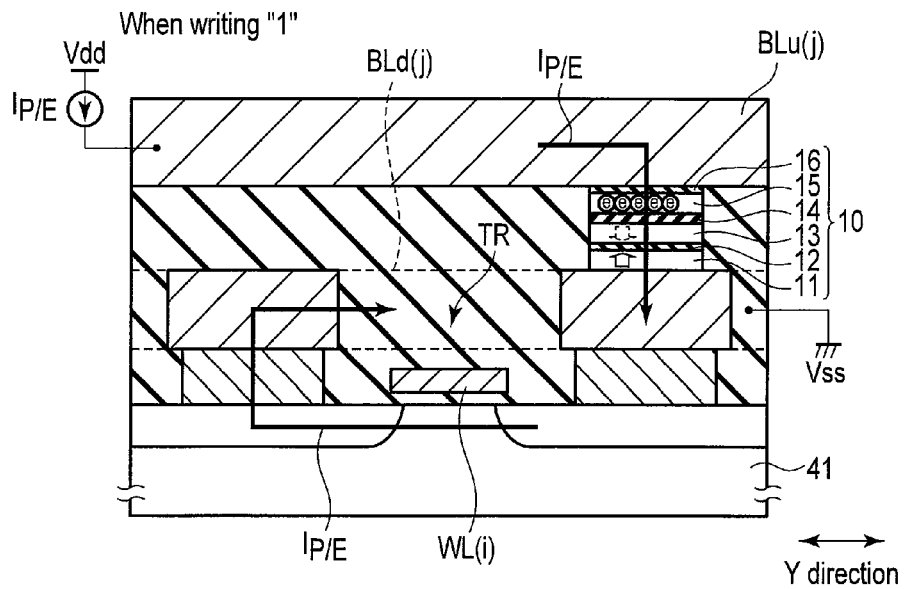
FIG. 28 is a sectional view showing a state of the memory cell when writing "1" in the magnetic random access memory in FIG. 27.

The magnetoresistive element 10 in each of the above embodiments can be modified in various ways. The reference layer 11 is not limited to being formed of one layer formed from one material system and may be formed by using a multi-layer magnetic layer. For example, as shown in FIGS. 26A and 26B, the reference layer 11 may be formed of two layers of a reference layer 11A and a reference layer 11B. Incidentally, FIGS. 26A and 26B show an erase operation and arrows indicate the direction of an electron current for erasing.

An example of accumulating electrons in the charge storage layer 15 has been described in each of the above embodiments, but holes may also be stored in the charge storage layer 15. That is, if the majority carrier (main carrier) of the diffusion layer is the hole (when acceptors are diffused), instead of the electron, holes will be injected into and discharged from the charge storage layer 15. Incidentally, when the majority carrier is the hole, the direction of the current described in each of the above embodiments is reversed.

[7] Application Examples of Magnetoresistive Element

Application examples of the magnetoresistive element 10 according to each of the above embodiments will be described.

In this section, examples of a magnetic random access memory (MRAM) and a probe memory as magnetic memories and an example of a spin field effect transistor (FET) to realize a re-configurable logic circuit will be described.

Write operations described below can be applied to the above erase operations and magnetic reset operations by appropriately changing the current direction.

[7-1] Magnetic Random Access Memory

When applying the magnetoresistive element 10 according to each of the above embodiments to a magnetic random access memory, the type or structure of a memory array is not limited. The 1-transistor 1-MTJ (magneto tunnel junction) type used for spin injection (spin transfer torque) write mode is used as a representative example.

[7-1-1] Circuit Structure

FIG. 27 shows the circuit structure of a memory cell array of a magnetic random access memory according to each of the above embodiments.

A memory cell array 31 is formed from a plurality of memory cells MC1, MC2, MC3, MC4 arranged in an array shape. Each of the memory cells MC1, MC2, MC3, MC4 is formed from the magnetoresistive element 10 and a MOS transistor TR connected in series.

The gate of the MOS transistor TR is connected to word lines WL(i), WL(i+1). The word lines WL(i), WL(i+1) extend in the X direction and one end thereof is connected to a word line driver 32 via a MOS transistor RSW as a row selection switch.

A row selection signal RSL(i), RSL(i+1) to select one row of the memory cell array 31 is input into the gate of the MOS transistor RSW for reading/writing.

The word line driver 32 drives the word line in the selected one row. If, for example, the word line WL(i) is selected, the line driver 32 sets the potential of the word line WL(i) to "H" to turn on the MOS transistor TR connected to the word line WL(i).

One end of the magnetoresistive element 10 constituting the memory cells MC1, MC2, MC3, MC4 is connected to bit lines BLu(j), BLu(j+1).

The bit lines BLu(j), BLu(j+1) extend in the Y direction crossing the X direction and one end thereof is connected to a bit line driver/sinker 33 via a MOS transistor CSWu as a column selection switch.

A column selection signal CSLu(j), CSLu(j+1) to select one column of the memory cell array 31 is input into the gate of the MOS transistor CSWu for reading/writing.

One end of the MOS transistor TR constituting the memory cells MC1, MC2, MC3, MC4 is connected to bit lines BLd(j), BLd(j+1).

The bit lines BLd(j), BLd(j+1) extend in the Y direction and one end thereof is connected to a bit line driver/sinker 34 via a MOS transistor CSWd as a column selection switch.

A column selection signal CSLd(j), CSLd(j+1) to select one column of the memory cell array 31 is input into the gate of the MOS transistor CSWd for writing.

One end of the bit lines BLd(j), BLd(j+1) is connected to a common read line RL via a MOS transistor CSWr as a column selection switch and the common read line RL is connected to a sense amplifier S/A.

A column selection signal CSLr(j), CSLr(j+1) to select one column of the memory cell array 31 is input into the gate of the MOS transistor CSWr when reading.

The sense amplifier S/A determines a data value of the magnetoresistive element 10 in the selected memory cell MC based on a reference potential Vref and outputs the data value as an output signal DATA.

The bit line drivers/sinkers 33, 34 are provided to pass a write/erase current $I_{P/E}$ to the bit line in the selected one column.

For example, "1" is assigned when the magnetization state of the magnetoresistive element 10 is a spin single layer and, for example, "0" is assigned when the magnetization state is a spin stacked layer (antiparallel).

When writing "1" to a memory cell MC1, the MOS transistor TR in the memory cell MC1 is turned on by setting the row selection signal RSL(i) to "H" and the word line WL(i) to "H".

Also, the column selection signals CSLu(j), CSLd(j) are set to "H" to pass the write/erase current $I_{P/E}$ from the bit line driver/sinker 33 toward the bit line driver/sinker 34 via the memory cell MC1. At this point, in the magnetoresistive element 10 inside the memory cell MC1, the spin in the recording layer 13 disappears due to charges accumulated in the charge storage layer 15. Accordingly, "1" is written.

When writing "0" to the memory cell MC1, similarly the MOS transistor TR in the memory cell MC1 is turned on by setting the row selection signal RSL(i) to "H" and the word line WL(i) to "H".

Also, the column selection signals CSLu(j), CSLd(j) are set to "H" to pass the write/erase current $I_{P/E}$ from the bit line driver/sinker 34 toward the bit line driver/sinker 33 via the memory cell MC1. At this point, in the magnetoresistive element 10 inside the memory cell MC1, charges in the charge storage layer 15 are discharged and the magnetization state becomes antiparallel due to spin-polarized electrons. Accordingly, "0" is written.

For example, the sense amplifier S/A and the bit line driver/sinker 33 are used for reading.

When reading, for example, data in the memory cell MC1, the MOS transistor TR in the memory cell MC1 is turned on by setting the row selection signal RSL(i) to "H" and the word line WL(i) to "H".

Also, the column selection signal CSLu(j) is set to "H" to electrically connect the bit line BLu(j) to the bit line driver/sinker 33 and the column selection signal CSLr(j) is set to "H" to electrically connect the bit line BLd(j) to the sense amplifier S/A.

The bit line driver/sinker 33 connects, for example, one end of the bit line BLu(j) to a ground point and the sense amplifier S/A supplies a read current to the memory cell MC1. The sense amplifier S/A detects the resistance value when the read current flows to the magnetoresistive element 10 inside the memory cell MC1 to determine the data value stored therein.

[7-1-2] Device Structure

FIGS. 28 to 31 show an example of the device structure of the memory cells MC1, MC2, MC3, MC4 in FIG. 27.

A memory cell is formed from the MOS transistor TR and the magnetoresistive element (magnetoresistive effect element) 10 according to each of the above embodiments.

The MOS transistor TR is formed on a semiconductor substrate 41. The gate electrode of the MOS transistor TR extends in the X direction (direction perpendicular to the paper surface) as the word line WL(i).

One of two source/drain diffusion layers of the MOS transistor TR is connected to a lower bit line BLd(j) and the other is connected to one end (undersurface) of the magnetoresistive element 10. The other end (top surface) of the magnetoresistive element 10 is connected to an upper bit line BLu(j).

The upper bit line BLu(j) and the lower bit line BLd(j) each extend in the Y direction.

The magnetoresistive element 10 has, for example, the reference layer 11, the non-magnetic layer 12, the recording layer 13, the first insulating layer 14, the charge storage layer 15, and the second insulating layer 16 stacked in this order from the side of the semiconductor substrate 41. The order of stacking may be reversed for the magnetoresistive element 10.

In a memory cell having the device structure described above, when writing "1", as shown in FIG. 28, the write/erase current $I_{P/E}$ is passed from a current source inside the bit line driver/sinker 33 in FIG. 27 toward the ground point via a path of the upper bit line BLu(j)->the magnetoresistive element 10->the lower bit line BLd(j).

At this point, an electron current flows from the reference layer 11 toward the recording layer 13 inside the magnetoresistive element 10 so that charges are accumulated in the charge storage layer 15. Accordingly, the spin in the recording layer 13 disappears to produce a spin single layer state.

Figure 29:
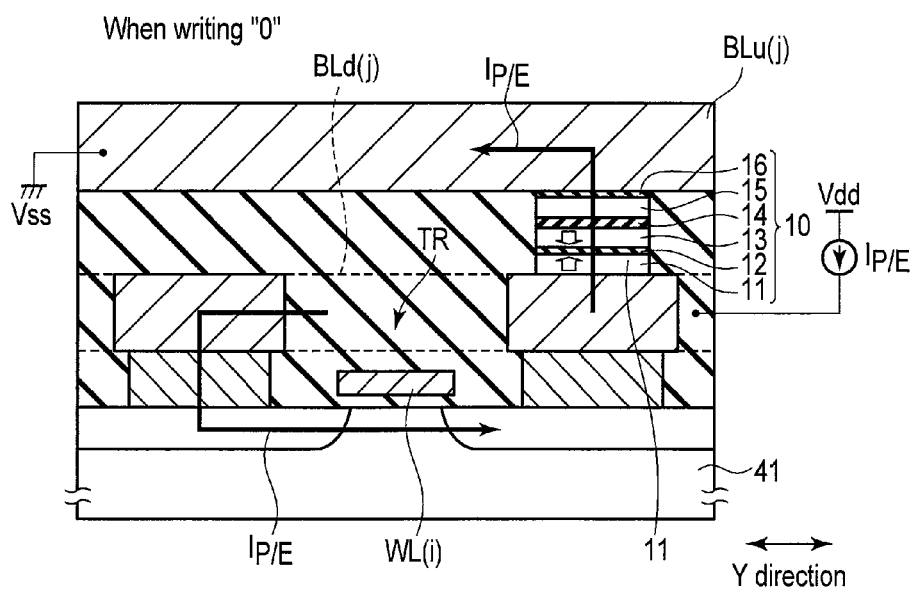
FIG. 29 is a sectional view showing the state of the memory cell when writing "0" in the magnetic random access memory in FIG. 27.

When writing "0", as shown in FIG. 29, the write/erase current $I_{P/E}$ is passed from a current source inside the bit line driver/sinker 34 in FIG. 27 toward the ground point via a path of the lower bit line BLd(j)->the magnetoresistive element 10->the upper bit line BLu(j).

At this point, an electron current flows from the recording layer 13 toward the reference layer 11 inside the magnetoresistive element 10 so that charges in the charge storage layer 15 are discharged. By passing the electron current from the recording layer 13 toward the reference layer 11, the magnetization of the recording layer 13 is in an antiparallel state with respect to the magnetization of the reference layer 11.

Figure 30:
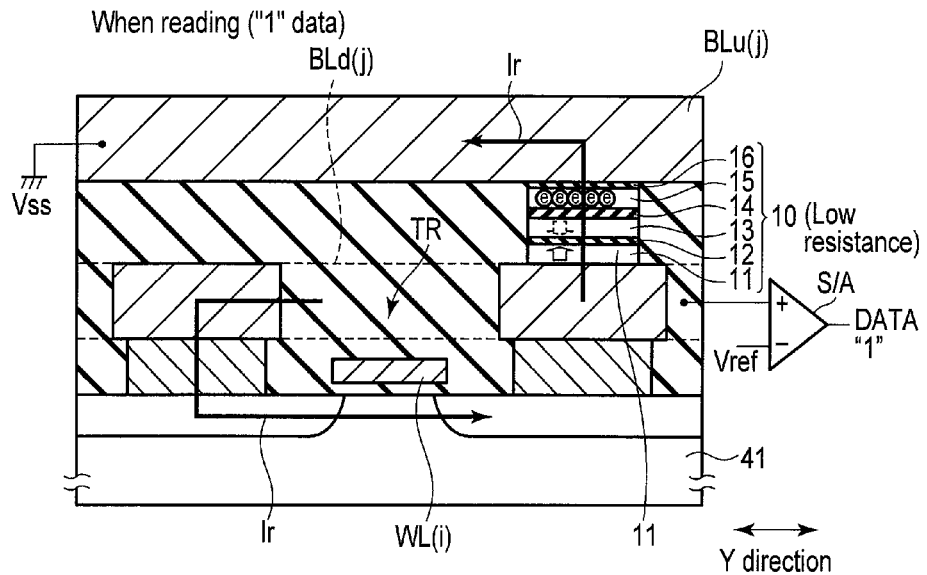
FIG. 30 is a sectional view showing the state of the memory cell when reading "1" in the magnetic random access memory in FIG. 27.
Figure 31:
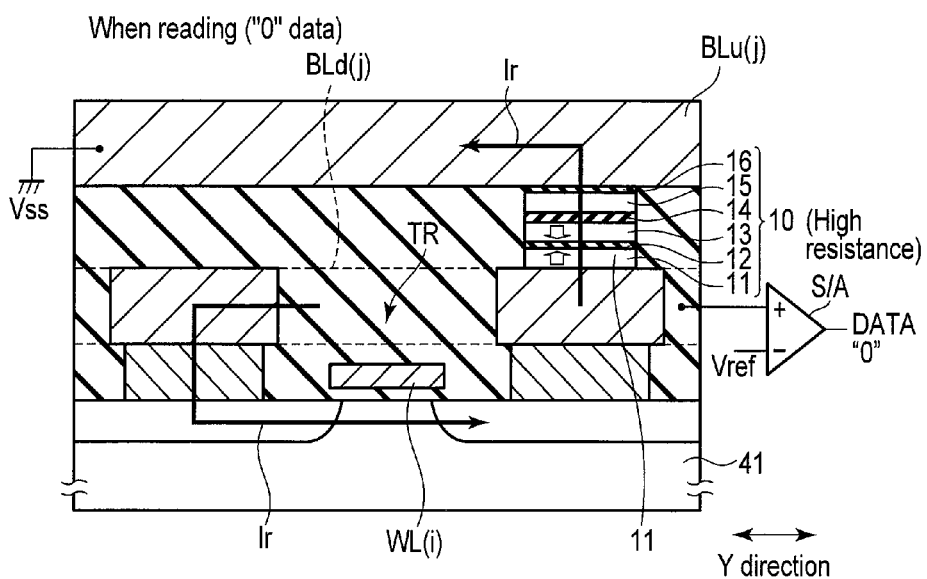
FIG. 31 is a sectional view showing the state of the memory cell when reading "0" in the magnetic random access memory in FIG. 27.

When reading, as shown in FIGS. 30 and 31, a read current Ir is passed, for example, from the sense amplifier S/A toward the ground point via the magnetoresistive element 10. When the read current Ir flows to the magnetoresistive element 10, the input potential of the sense/amplifier S/A changes depending on the state of the magnetoresistive element 10.

When, for example, as shown in FIG. 30, "1"-data is stored in the magnetoresistive element 10, the resistance value of the magnetoresistive element 10 becomes smaller (spin single layer state) and the input potential of the sense amplifier S/A is lower than the reference potential Vref.

Therefore, the sense amplifier S/A outputs "1" as the output signal DATA.

When, as shown in FIG. 31, "0"-data is stored in the magnetoresistive element 10, the resistance value of the magnetoresistive element 10 becomes larger (antiparallel state) and the input potential of the sense amplifier S/A is higher than the reference potential Vref.

Therefore, the sense amplifier S/A outputs "0" as the output signal DATA.

The direction of the read current Ir in the present example is a direction from the lower bit line BLd(j) toward the upper bit line BLu(j), but the direction may be reversed, that is, the direction from the upper bit line BLu(j) toward the lower bit line BLd(j) may be adopted. A method that is different from the method in the present example may be adopted as the reading method.

The value of the read current Ir is made sufficiently smaller than the value of the write/erase current $I_{P/E}$ to suppress a disturbance when reading. More specifically, the value of the read current Ir may be made smaller than a critical current Ic of magnetization reversal.

In the present example, "1" is assigned when the magnetization state of the magnetoresistive element 10 is a spin single layer and "0" is assigned when the magnetization state is antiparallel, but the assignment may be reversed. Also, "1" may be assigned when the magnetization state of the magnetoresistive element 10 is a spin single layer and "0" may be assigned when the magnetization state is parallel and also the assignment may be reversed.

For reading, it is preferable to form the tunnel barrier layer from a high-resistance material, for example, an insulating material such as alumina and MgO to obtain increased signal output by increasing the MR (magneto-resistive) ratio.

It is more favorable for reading if, instead of the tunnel barrier layer, a CPP-CPP-MR material or nano-contact MR material having Cu or a magnetic body embedded in many holes provided in the insulating material is adopted as the non-magnetic layer 12 between the recording layer 13 and the reference layer 11.

If the MOS transistor TR constituting a memory cell has a function as a selection switch, no problem is caused if replaced by an element such as a bipolar transistor or diode.

[7-1-3] Layout of the Magnetoresistive Element

Various types including a type related to the memory cell array structure can be assumed for the layout of the magnetoresistive element 10.

The memory cell array in FIGS. 28 to 31 is a 1-transistor 1-MTJ type in which the memory cell is formed of one transistor and one magnetoresistive element. In this case, the one independent magnetoresistive element 10 is allocated to one memory cell.

Figure 32:
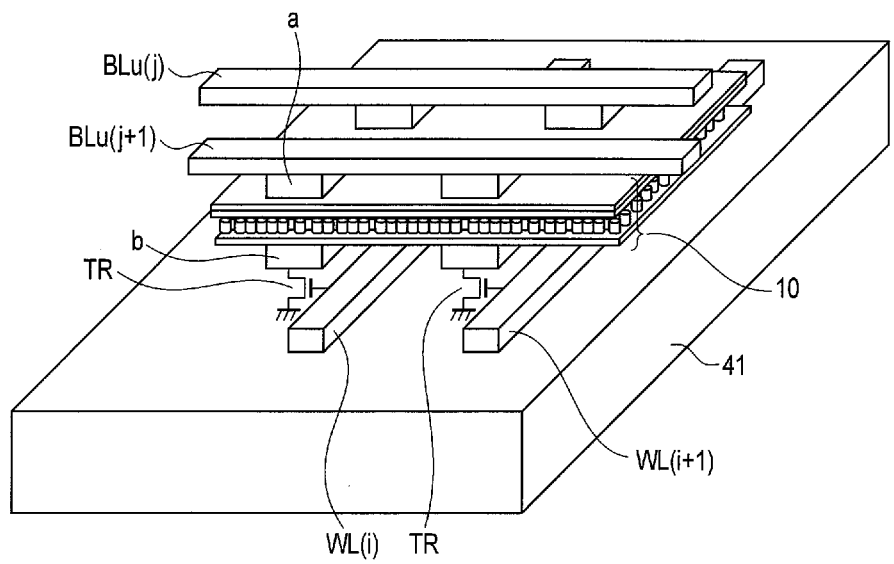
FIG. 32 is a diagram exemplifying a layout of the magnetoresistive element according to each embodiment.

In a 1-transistor 1-MTJ type memory cell array, by contrast, as shown in FIG. 32, the magnetoresistive element 10 may be formed of an aggregate of a plurality of magnetic particles (polycrystal structure) separated by a non-magnetic material to integrate the magnetoresistive element 10 of all memory cells.

In this case, the magnetoresistive element 10 is solidly formed above the semiconductor substrate 41 and thus, the manufacturing process is simplified and lower manufacturing costs can be realized.

Also in such a structure, the magnetoresistive element 10 is made of an aggregate of the plurality of magnetic particles and the magnetization direction can be determined for each magnetic particle and thus, only the magnetization in a region between plugs a and b can selectively be changed.

Therefore, the function as a magnetic memory is no different from a magnetic memory of the structure in FIGS. 28 to 31.

Figure 33:
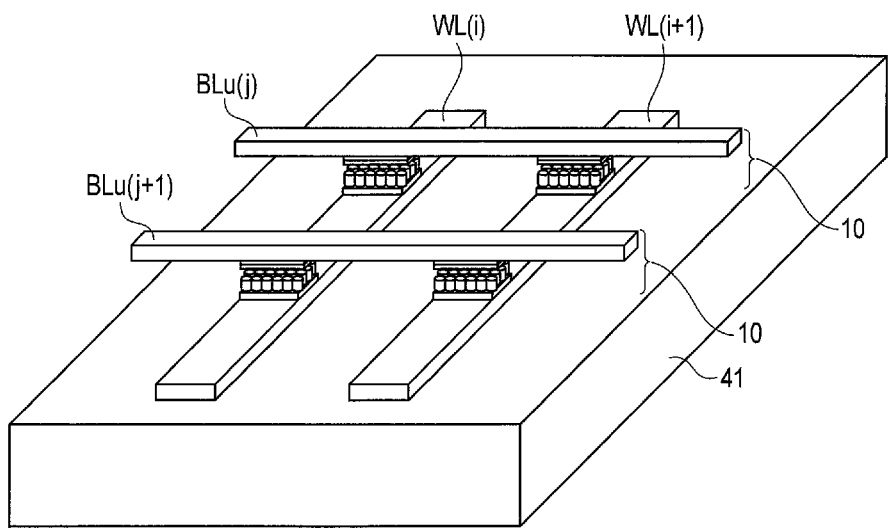
FIG. 33 is a diagram exemplifying the layout of the magnetoresistive element according to each embodiment.

The memory cell array in FIGS. 33 to 35 is a cross-point type.

In the structure in FIG. 33, like the structure in FIGS. 28 to 31, the one independent magnetoresistive element 10 is allocated to one memory cell.

In the structure in FIG. 34, the magnetoresistive element 10 is laid out along the bit lines BL(j), BL(j+1) directly below the bit lines BL(j), BL(j+1). In this case, the magnetoresistive element 10 is processed simultaneously with the processing of the bit lines BL(j), BL(j+1) and thus, the manufacturing process is simplified and lower manufacturing costs can be realized.

In the structure in FIG. 35, the magnetoresistive element 10 is formed solidly in a region between the word lines WL(i), WL(i+1) and the bit lines BL(j), BL(j+1). In this case, the processing of the magnetoresistive element 10 can be omitted and thus, the manufacturing process is simplified and lower manufacturing costs can be realized.

Also in the structures in FIGS. 34 and 35, the magnetoresistive element 10 is made of an aggregate of a plurality of magnetic particles and the magnetization direction can be determined for each magnetic particle and thus, only the magnetization at intersections of the word lines WL(i), WL(i+1) and the bit lines BL(j), BL(j+1) can selectively be changed.

Therefore, the function as a magnetic memory is the same in all cross-point type magnetic memories in FIGS. 33 to 35.

[7-2] Probe Memory

The probe memory is a next-generation memory having the potential for being able to dramatically improve the recording density when compared with the current memories.

The probe memory has a probe in, for example, a cantilever shape in an upper portion of a recording medium and performs an access operation by controlling the physical relationship between the recording medium and the probe. Particularly, if the MEMS (micro electro mechanical systems) technology is used, the recording medium and the probe can be mounted on a semiconductor chip together and in fact, concrete suggestions such as Millipede have been made.

If the magnetoresistive element 10 in each of the above embodiments is used as a recording medium of such a probe memory, a contribution can be made to commercialization of the probe memory.

[7-2-1] Basic Structure

Figure 36:
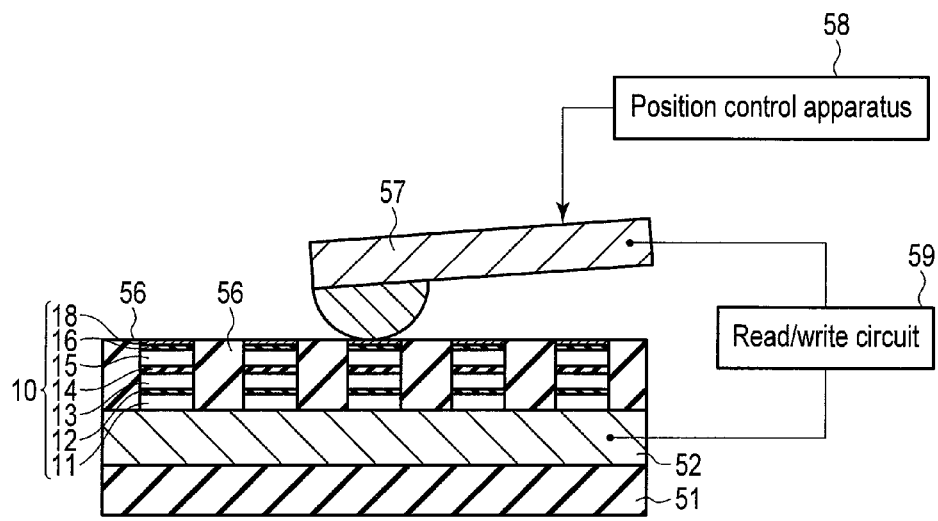
FIG. 36 is a diagram showing a basic structure of a probe memory as an application example of the magnetoresistive element according to each embodiment.

FIG. 36 shows a basic structure of a probe memory.

A conductive layer 52 is formed on an insulating substrate 51 and a plurality of the magnetoresistive elements 10 according to each of the above embodiments is arranged on the conductive layer 52 in an array shape. Each of the magnetoresistive elements 10 has a stacked structure including the reference layer 11, the non-magnetic layer 12, the recording layer 13, the first insulating layer 14, the charge storage layer 15, the second insulating layer 16, and the wiring 18. The space between the plurality of the magnetoresistive elements 10 is filled with an insulating layer 56.

An array of the above magnetoresistive elements 10 is called a "patterned medium".

A probe 57 in, for example, a cantilever shape is arranged on the patterned medium. The shape of the probe 57 is not specifically limited and may be needle-shaped, but adopting the cantilever shape is advantageous when a probe is created on a semiconductor chip based on MEMS technology.

The position of the probe 57 is controlled by a position control apparatus 58. For example, the position control apparatus 58 drives the probe 57 two-dimensionally (x, y) or three-dimensionally (x, y, z), thereby performing an access operation. The probe 57 may be always in contact with the top surface of the patterned medium or always a fixed distance away.

A read/write circuit 59 passes a read current to the magnetoresistive element 10 when reading to read data stored in the magnetoresistive element 10. The read/write circuit 59 passes a write/erase current oriented in accordance with write data to the magnetoresistive element 10 when writing to control the magnetization state of the magnetoresistive element 10.

When writing "1" to such a probe memory, the position control apparatus 58 decides the relative position between the patterned medium and the probe 57 based on an address signal and the read/write circuit 59 passes the write/erase current $I_{P/E}$ in a direction from the conductive layer 52 toward the probe 57.

At this point, the electron current flows from the recording layer 13 toward the reference layer 11 inside the magnetoresistive element 10 and thus, the magnetization of the recording layer 13 becomes antiparallel to the magnetization of the reference layer 11.

When writing "0", the position control apparatus 58 decides the relative position between the patterned medium and the probe 57 based on an address signal and the read/write circuit 59 passes the write/erase current $I_{P/E}$ in a direction from the probe 57 toward the conductive layer 52.

At this point, an electron current flows from the reference layer 11 toward the recording layer 13 inside the magnetoresistive element 10. In this case, the spin in the recording layer 13 disappears due to accumulated charges in the charge storage layer 15 to produce a spin single layer state.

When reading, the position control apparatus 58 decides the relative position between the patterned medium and the probe 57 based on an address signal and the read/write circuit 59 supplies the read current Ir to the magnetoresistive element 10.

The direction of the read current Ir is not limited, but the value of the read current Ir is made sufficiently smaller than the value of the write/erase current $I_{P/E}$ to suppress the disturbance when reading. More specifically, the value of the read current Ir is made smaller than the critical current Ic of magnetization reversal.

In the present example, "1" is assigned when the magnetization state of the magnetoresistive element 10 is antiparallel and "0" is assigned when the magnetization state is a spin single layer, but the assignment may be reversed. Also, "1" may be assigned when the magnetization state of the magnetoresistive element 10 is parallel and "0" may be assigned when the magnetization state is a spin single layer and also the assignment may be reversed.

For reading, it is preferable to adopt the tunnel barrier layer (for example, an insulating material such as alumina and MgO) as the non-magnetic layer 12 to obtain increased signal output by increasing the MR ratio.

It is more favorable for reading if, instead of the tunnel barrier layer, a CPP-CPP-MR material or nano-contact MR material having Cu or a magnetic body embedded in many holes provided in the insulating material is adopted as the non-magnetic layer 12 between the recording layer 13 and the reference layer 11.

The example in FIG. 36 is a system in which the patterned medium is fixed and the position of the probe 57 is controlled by the position control apparatus 58, but if the relative position between the patterned medium and the probe 57 can be controlled, any of the probe 57 and the insulating substrate 51 may be driven.

Figure 37:
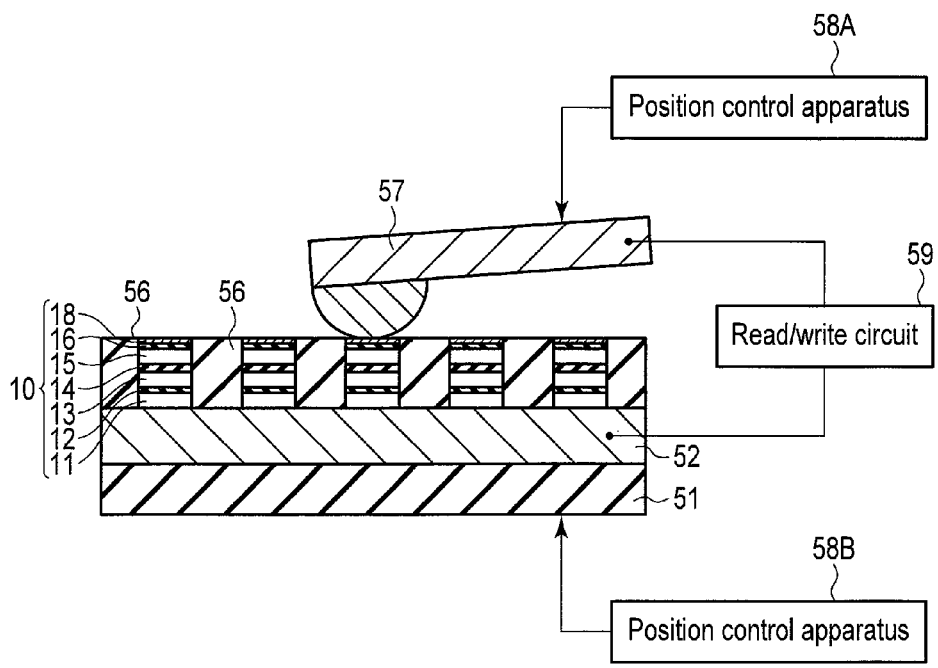
FIG. 37 is a diagram showing a modification of the probe memory in FIG. 36.

For example, as shown in FIG. 37, the relative position between the patterned medium and the probe can be controlled by position control apparatuses 58A, 58B.

Alternatively, like a disk drive, an access operation may be performed by rotating the insulating substrate 51 to linearly drive the probe 57.

Figure 38:
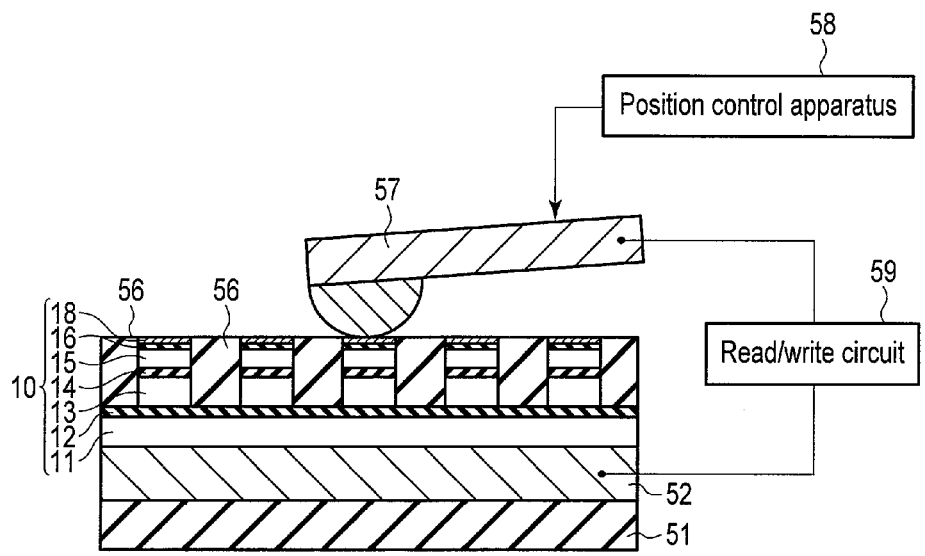
FIG. 38 is a diagram showing a modification of the probe memory in FIG. 36.
Figure 39:
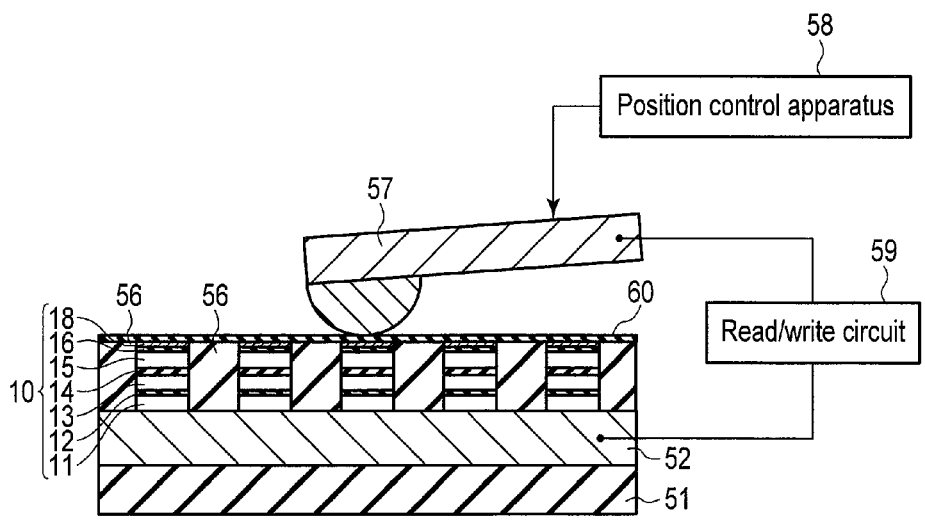
FIG. 39 is a diagram showing a modification of the probe memory in FIG. 36.

FIGS. 38 and 39 are modifications of the probe memory in FIG. 36.

In the probe memory in FIG. 38, the reference layer 11 and the non-magnetic layer 12 are shared by all the magnetoresistive elements 10. In this case, the reference layer 11 and the non-magnetic layer 12 are solidly formed on the conductive layer 52 and only laminated layers above the recording layer 13 need to be patterned so that simplification of the manufacturing process and improvement of element properties can be realized.

In the probe memory in FIG. 39, the top surface of the patterned medium is covered with a protective layer 60. The protective layer 60 is formed of, for example, an ultrathin insulator. In this case, the probe 57 is not directly in contact with the magnetoresistive element 10 so that improvements of reliability and the read/write count of the magnetoresistive element 10 can be realized.

Instead of the protective layer 60, the probe 57 may be separated a fixed distance away from the magnetoresistive element 10 to provide a space between the probe 57 and the magnetoresistive element 10. Alternatively, in addition to providing the protective layer 60, the probe 57 may be separated a fixed distance away from the protective layer 60.

[7-2-2] Multi-Probe Structure

An example of the probe memory in a multi-probe structure suitable for higher recording densities will be described.

FIG. 40 shows a circuit structure of the probe memory according to each of the above embodiments.

Blocks BK11, . . . , BKij are arranged in a matrix shape. The blocks BK11, . . . , BKij may be physically separated from each other or integrated. Each of the blocks BK11, . . . , BKij is formed of, for example, as shown in FIG. 35, a patterned medium made of a plurality of magnetoresistive elements.

If the blocks BK11, . . . , BKij are arranged in a matrix shape of 32×32 as a whole and each of the blocks BK11, . . . , BKij is formed from 32×32 magnetoresistive elements, the storage capacity of one block is 1 kilobits and the storage capacity as a probe memory is 1 megabits.

Like the blocks BK11, . . . , BKij, the probes 57 are arranged in a matrix shape and there is a one-to-one correspondence between the probe 57 and the block BKij.

The probes 57 are connected to the bit lines BLu(1), . . . , BLu(j) via the MOS transistor TR.

The gates of the MOS transistors TR are connected to the word lines WL(1), . . . , WL(i). The word lines WL(1), . . . , WL(i) extend in the X direction and one end thereof is connected to the word line driver 32 via the MOS transistor RSW as a row selection switch.

A row selection signal RSL(1), . . . , RSL(i) to select one of the blocks BK11, . . . , BKij is input into the gate of the MOS transistor RSW when reading/writing.

The word line driver 32 drives the word line in the selected one row. If, for example, the word line WL(1) is selected, the line driver 32 sets the potential of the word line WL(1) to "H" to turn on the MOS transistor TR connected to the word line WL(1).

The bit lines BLu(1), . . . , BLu(j) extend in the Y direction crossing the X direction and one end thereof is connected to the bit line driver/sinker 33 via the MOS transistor CSWu as a column selection switch.

A column selection signal CSLu(1), . . . , CSLu(j) to select one of the blocks BK11, . . . , BKij is input into the gate of the MOS transistor CSWu when reading/writing.

One end (corresponding to the conductive layer 52 in FIG. 38) of the blocks BK11, . . . , BKij is connected to the bit lines BLd(1), . . . , BLd(j).

The bit lines BLd(1), . . . , BLd(j) extend in the Y direction and one end thereof is connected to the bit line driver/sinker 34 via the MOS transistor CSWd as a column selection switch.

A column selection signal CSLd(1), . . . , CSLd(j) to select one of the blocks BK11, . . . , BKij is input into the gate of the MOS transistor CSWd when writing.

One end of the bit lines BLd(1), . . . , BLd(j) is connected to the common read line RL via the MOS transistor CSWr as a column selection switch and the common read line RL is connected to the sense amplifier S/A.

A column selection signal CSLr(1), . . . , CSLr(j) to select one of the blocks BK11, . . . , BKij is input into the gate of the MOS transistor CSWr when reading.

The sense amplifier S/A determines a data value of the magnetoresistive element in the selected block BKij based on the reference potential Vref and outputs the data value as the output signal DATA.

The bit line drivers/sinkers 33, 34 are provided to pass the write/erase current $I_{P/E}$ to the selected magnetoresistive element in the selected one block BKij.

"1" is assigned when the magnetization state of the magnetoresistive element is antiparallel and "0" is assigned when the magnetization state is a spin single layer.

When writing "1" to a magnetoresistive element inside the block BK11, the MOS transistor TR corresponding to the block BK11 is turned on by setting the row selection signal RSL(1) to "H" and the word line WL(1) to "H".

Also, the column selection signals CSLu(1), CSLd(1) are set to "H" to pass the write/erase current $I_{P/E}$ from the bit line driver/sinker 33 toward the bit line driver/sinker 34 via the magnetoresistive element inside the block BK11. At this point, the magnetization state of the magnetoresistive element inside the block BK11 is a spin single layer and "1" is written.

When writing "0" to a magnetoresistive element inside the block BK11, the MOS transistor TR corresponding to the block BK11 is turned on by setting the row selection signal RSL(1) to "H" and the word line WL(1) to "H".

Also, the column selection signals CSLu(1), CSLd(1) are set to "H" to pass the write/erase current $I_{P/E}$ from the bit line driver/sinker 34 toward the bit line driver/sinker 33 via the magnetoresistive element inside the block BK11. At this point, the magnetization state of the magnetoresistive element inside the block BK11 is antiparallel and "0" is written.

For example, the sense amplifier S/A and the bit line driver/sinker 33 are used for reading.

When reading, for example, data in a magnetoresistive element inside the block BK11, the MOS transistor TR corresponding to the block BK11 is turned on by setting the row selection signal RSL(1) to "H" and the word line WL(1) to "H".

Also, the column selection signal CSLu(1) is set to "H" to electrically connect the bit line BLu(1) to the bit line driver/sinker 33 and the column selection signal CSLr(1) is set to "H" to electrically connect the bit line BLd(1) to the sense amplifier S/A.

The bit line driver/sinker 33 connects, for example, one end of the bit line BLu(1) to a ground point and the sense amplifier S/A supplies a read current to a magnetoresistive element inside the block BK11. The sense amplifier S/A detects the resistance value when the read current flows to the magnetoresistive element to determine the data value stored therein.

Figure 41:
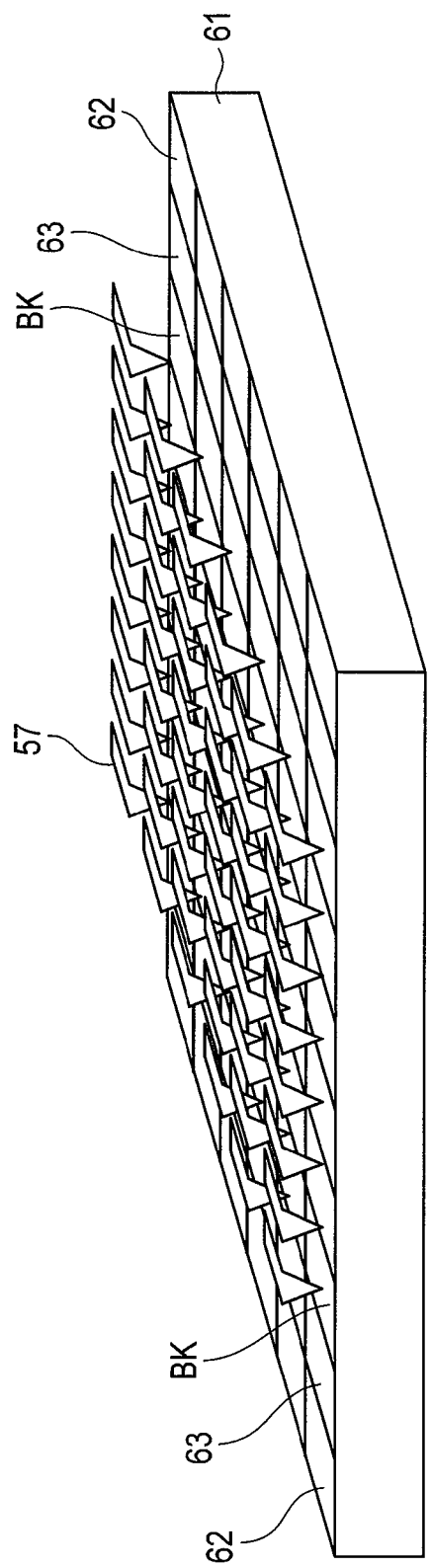
FIG. 41 is a diagram showing a device structure of the probe memory in FIG. 40.

FIG. 41 shows an example of the device structure of a probe memory in the multi-probe structure.

In the probe memory, a patterned medium as a recording medium is solidly formed in the center of a semiconductor chip 61 and also the patterned medium is divided into a plurality of blocks BK. A plurality of the probes 57 is arranged on the plurality of blocks BK corresponding to the plurality of blocks BK.

In a peripheral portion of the semiconductor chip 61, for example, a servo region 62 where the position control apparatus 58 in FIG. 36 is formed and a peripheral circuit region 63 where the read/write circuit 59 in FIG. 36 is formed are provided.

In the device structure, the entire system shown in FIG. 36 is mounted on the semiconductor chip 61. Such a semiconductor device is enabled by using the MEMS technology.

[7-3] Spin FET

The magnetoresistive element 10 according to each of the above embodiments can also be applied to a spin FET.

The spin FET can itself be used as a memory cell of a magnetic memory and also receives attention as an element of a re-configurable logic circuit.

FIG. 42 shows an example of the device structure of a spin FET.

Source/drain regions formed from a ferromagnetic layer are formed inside a semiconductor substrate 70. One source/drain region is a recording layer (F) 13 in which the magnetization direction changes and another is a reference layer (P) 11. The magnetization of the reference layer 11 is locked by an antiferromagnetic layer (A) 75.

A non-magnetic layer (tunnel barrier layer) 12A is formed between the semiconductor substrate 70 and the recording layer 13 and between the semiconductor substrate 70 and the reference layer 11. In addition, a gate electrode 72 is formed in a channel region between the recording layer 13 and the reference layer 11 via a gate insulating layer 71.

The charge storage layer 15 sandwiched between the insulating layers 14, 16 is formed on the recording layer 13.

Source/drain electrodes 73, 74 are formed on the antiferromagnetic layer 75 and the insulating layer 16 respectively.

The source/drain electrode 73 is connected to drivers/sinkers that generate a write/erase current, that is, a P-channel MOS transistor P1 and an N-channel MOS transistor N1.

Similarly, the source/drain electrode 74 is connected to drivers/sinkers that generate a write/erase current, that is, a P-channel MOS transistor P2 and an N-channel MOS transistor N2.

The spin FET in the structure described above writes data by giving a write gate voltage W to the gate electrode 72 to change the spin of the recording layer 13 as a source/drain region.

The value of write data is decided based on the orientation of a write/erase current and the orientation of the write/erase current is controlled by ON/OFF of the P-channel MOS transistors P1, P2 and the N-channel MOS transistors N1, N2 by control signals A, B, C, D.

When, for example, the magnetization states of the source/drain regions (the recording layer and reference layer) 11, 13 should be made antiparallel, the write/drain current is passed from the P-channel MOS transistor P1 toward the N-channel MOS transistor N2. At this point, the electron current flows from the recording layer 13 toward the reference layer 11 and thus, the magnetization direction of the recording layer 13 is the opposite direction of the magnetization direction of the reference layer 11.

When the magnetization of the one (recording layer) 13 of the source/drain regions should be made to disappear, the write/drain current is passed from the P-channel MOS transistor P2 toward the N-channel MOS transistor N1. At this point, the electron current flows from the reference layer 11 toward the recording layer 13 so that charges are accumulated in the charge storage layer 15. Accordingly, the magnetization in the recording layer 13 disappears to produce a spin single layer state.

While the tunnel barrier type spin FET has been described in the present example, but the spin FET may be a Schottky barrier type that does not have the tunnel barrier layer 12A.

In [7] described above, three application examples of the magnetoresistive element 10 according to each of the above embodiments have been described, but the magnetoresistive element 10 according to each of the above embodiments can be applied to other spintronic devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element, comprising:
    a first magnetic layer;
    a second magnetic layer;
    a non-magnetic layer formed between the first magnetic layer and the second magnetic layer;
    a charge storage layer having a first surface and a second surface different from the first surface, the first surface facing the second magnetic layer;
    a first insulating layer formed between the second magnetic layer and the first surface of the charge storage layer; and
    a second insulating layer formed on the second surface of the charge storage layer.

2. The element according to claim 1,
    wherein a magnetization state of the second magnetic layer is changed between a ferromagnetic state and a paramagnetic state by accumulating charges in or discharging charges from the charge storage layer t write or erase information.

3. The element according to claim 1,
    wherein the second surface is located in the side opposite to the first surface, and
    the first insulating layer and the second insulating layer have different thicknesses.

4. The element according to claim 1,
    wherein the charge storage layer is formed by one of silicon nitride ($Si_3N_4$), hafnium oxide ($HfO_2$), and Si.

5. The element according to claim 1,
    wherein the first and second insulating layers are formed by one of silicon oxide ($SiO_2$), aluminum oxide ($Al_2O_3$), a laminated film of silicon oxide ($SiO_2$) and silicon nitride ($Si_3N_4$), and a laminated film of silicon oxide ($SiO_2$), silicon nitride ($Si_3N_4$), and aluminum oxide ($Al_2O_3$).

6. The element according to claim 1,
    wherein the non-magnetic layer is an electric insulator and contains at least one of aluminum oxide ($Al_2O_3$), silicon oxide ($SiO_2$), cobalt oxide (CoO), iron oxide ($Fe_2O_3$), magnesium oxide (MgO), nickel oxide (NiO), tantalum oxide ($Ta_2O_5$), titanium oxide ($TiO_2$), and zinc oxide (ZnO).

7. The element according to claim 1,
    wherein the first and second insulating layers are made of an alloy containing at least one of Co, Cr, Cu, Fe, Gd, Ir, Mn, Ni, Pd, Pt, Ru, Rh, and Tb or a laminated film of these elements.

8. The element according to claim 1,
    wherein the charge storage layer has a cylindrical shape and
    the first insulating layer, the second magnetic layer, the non-magnetic layer, and the first magnetic layer are formed by surrounding a side face of the charge storage layer.

9. The element according to claim 1,
    wherein the charge storage layer is formed in a semiconductor substrate and
    the first insulating layer, the second magnetic layer, the non-magnetic layer, and the first magnetic layer are stacked on the semiconductor substrate and the charge storage layer.

10. The element according to claim 1,
    wherein the charge storage layer is formed in a semiconductor layer constituting an SOI substrate and
    the first insulating layer, the second magnetic layer, the non-magnetic layer, and the first magnetic layer are stacked on the semiconductor substrate and the charge storage layer.

11. The element according to claim 8,
    wherein a length in a first direction parallel to a film surface of the second magnetic layer is longer than a length in the first direction of the charge storage layer and gaps are present where the second magnetic layer and the first surface of the charge storage layer are not facing each other.

12. The element according to claim 1,
    wherein the first insulating layer has a thickness of 5 nm or more and 10 nm or less.

13. The element according to claim 1,
    wherein the second insulating layer has a thickness of 5 nm or more and 35 nm or less.

14. The element according to claim 1,
    wherein the first and second insulating layers have an equivalence thickness ratio of 1.1 or more and 1.5 or less.

15. The element according to claim 1,
    wherein the charge storage layer has a thickness of 1 nm or more and 10 nm or less.

16. A writing method of a magnetic memory including a magnetoresistive element having
    a first magnetic layer;
    a second magnetic layer;
    a non-magnetic layer formed between the first magnetic layer and the second magnetic layer;
    a charge storage layer having a first surface and a second surface different from the first surface, the first surface facing the second magnetic layer;
    a first insulating layer formed between the second magnetic layer and the first surface of the charge storage layer; and
    a second insulating layer formed on the second surface of the charge storage layer,
    the method comprising:
    a first step of causing a spin in the second magnetic layer to disappear to change the first and second magnetic layers to a spin single layer state by applying a voltage or a current to the magnetoresistive element to accumulate charges in the charge storage layer and
    a second step of causing the spins of the first and second magnetic layers to be parallel state or antiparallel state by applying the voltage or the current to the magnetoresistive element to discharge the charges accumulated in the charge storage layer.

17. The method according to claim 16,
    wherein a magnetization state of the second magnetic layer changes from a ferromagnetic state to a paramagnetic state during the first step and
    the magnetization state of the second magnetic layer changes from the paramagnetic state to the ferromagnetic state during the second step.

* * * * *